United States Patent
Schleder et al.

(10) Patent No.: US 12,296,558 B2
(45) Date of Patent: May 13, 2025

(54) LEAKAGE CURRENT DETECTION AND CONTROL FOR ONE OR MORE ELECTRICALLY CONTROLLABLE PRIVACY GLAZING STRUCTURES

(71) Applicant: Cardinal IG Company, Eden Prairie, MN (US)

(72) Inventors: Nicholas Schleder, Saint Paul, MN (US); Hari Atkuri, Plymouth, MN (US); Andrew DeMiglio, Savage, MN (US); Michael Eul, Grant, MN (US)

(73) Assignee: Cardinal IG Company, Eden Prairie, MN (US)

( * ) Notice: Subject to any disclaimer, the term of this patent is extended or adjusted under 35 U.S.C. 154(b) by 0 days.

(21) Appl. No.: 18/521,662

(22) Filed: Nov. 28, 2023

(65) Prior Publication Data

US 2024/0092064 A1    Mar. 21, 2024

Related U.S. Application Data

(62) Division of application No. 17/739,443, filed on May 9, 2022, now Pat. No. 11,826,986, which is a division
(Continued)

(51) Int. Cl.
*G02F 1/137* (2006.01)
*B32B 17/10* (2006.01)
(Continued)

(52) U.S. Cl.
CPC ........ *B32B 17/10174* (2013.01); *G01R 31/52* (2020.01); *G02F 1/13756* (2021.01);
(Continued)

(58) Field of Classification Search
CPC ................................................. G02F 1/13756
See application file for complete search history.

(56) References Cited

U.S. PATENT DOCUMENTS

| | | | |
|---|---|---|---|
| 3,951,846 | A | 4/1976 | Gavrilovic |
| 3,953,630 | A | 4/1976 | Roberts et al. |

(Continued)

FOREIGN PATENT DOCUMENTS

| | | |
|---|---|---|
| CN | 201226062 Y | 4/2009 |
| CN | 101775953 A | 7/2010 |

(Continued)

OTHER PUBLICATIONS

Bortolozzo et al., Abstract of "Transmissive Liquid Crystal Light-valve for Near-Infrared Applications," Appl. Opt., 52(22), Aug. 2013, accessed on the internet at https://www.osapublishing.org/ao/abstract.cfm?uri=ao-52-22-E73, retrieved Sep. 26, 2019, 2 pages.

(Continued)

*Primary Examiner* — Edmond C Lau
(74) *Attorney, Agent, or Firm* — Fredrikson & Byron, P.A.

(57) ABSTRACT

An electrical characteristic of a privacy glazing structure and indicative of a health of the privacy glazing structure can be measured at a first time and at a second time later than the first time. In response to detecting a change in the electrical characteristic indicating a change in the health of the privacy glazing structure, one or more parameters of an electrical drive signal can be adjusted to compensate for the change in the health of the privacy glazing structure. The electrical characteristic can be measured at a plurality of times after the second time and compared to the electrical characteristic measured at the first time. If, at any of the plurality of times, the measured electrical characteristic differs from the electrical characteristic measured at the first time by more than a threshold amount, one or more parameters of the electrical drive signal can be adjusted.

13 Claims, 15 Drawing Sheets

Related U.S. Application Data of application No. 16/861,388, filed on Apr. 29, 2020, now Pat. No. 11,325,352.

(60) Provisional application No. 62/840,038, filed on Apr. 29, 2019.

(51) Int. Cl.
  *G01R 31/52* (2020.01)
  *G02F 1/155* (2006.01)
  *G02F 1/1343* (2006.01)

(52) U.S. Cl.
  CPC ........ *G02F 1/155* (2013.01); *B32B 2307/202* (2013.01); *G02F 1/1343* (2013.01)

(56) References Cited

U.S. PATENT DOCUMENTS

| | | |
|---|---|---|
| 4,047,351 A | 9/1977 | Derner et al. |
| 4,150,877 A | 4/1979 | Kobale et al. |
| 4,277,294 A | 7/1981 | Orcutt |
| 4,284,677 A | 8/1981 | Herliczek |
| 4,465,340 A | 8/1984 | Suganuma |
| 4,587,784 A | 5/1986 | Chavy et al. |
| 4,614,676 A | 9/1986 | Rehfeld |
| 4,702,566 A | 10/1987 | Tukude |
| 4,749,261 A | 6/1988 | Mclaughlin et al. |
| 4,932,608 A | 6/1990 | Heidish et al. |
| 4,958,917 A | 9/1990 | Hashimoto et al. |
| 5,076,673 A | 12/1991 | Lynam et al. |
| 5,103,336 A | 4/1992 | Sieloff |
| 5,111,329 A | 5/1992 | Gajewski et al. |
| 5,111,629 A | 5/1992 | Baughman et al. |
| 5,142,644 A | 8/1992 | Vansteenkiste et al. |
| 5,151,824 A | 9/1992 | O'Farrell |
| 5,154,953 A | 10/1992 | De Moncuit et al. |
| 5,164,853 A | 11/1992 | Shimazaki |
| 5,168,387 A | 12/1992 | Asakura et al. |
| 5,197,242 A | 3/1993 | Baughman et al. |
| 5,202,787 A | 4/1993 | Byker et al. |
| 5,239,406 A | 8/1993 | Lynam |
| 5,244,557 A | 9/1993 | Defendini et al. |
| 5,408,353 A | 4/1995 | Nichols et al. |
| 5,589,958 A | 12/1996 | Lieb |
| 5,643,644 A | 7/1997 | Demars |
| 5,668,663 A | 9/1997 | Varaprasad et al. |
| 5,766,755 A | 6/1998 | Chaussade et al. |
| 5,796,452 A | 8/1998 | Pierson |
| 5,855,638 A | 1/1999 | Demars |
| 5,889,608 A | 3/1999 | Buffat et al. |
| 6,001,487 A | 12/1999 | Ladang et al. |
| 6,055,088 A | 4/2000 | Fix et al. |
| 6,061,105 A | 5/2000 | Nakagawa |
| 6,064,509 A | 5/2000 | Tonar et al. |
| 6,143,209 A | 11/2000 | Lynam |
| 6,261,652 B1 | 7/2001 | Poix et al. |
| 6,280,041 B1 | 8/2001 | Unger et al. |
| 6,297,900 B1 | 10/2001 | Tulloch et al. |
| 6,317,248 B1 | 11/2001 | Agrawal et al. |
| 6,340,963 B1 | 1/2002 | Anno et al. |
| 6,366,391 B1 | 4/2002 | Hurtz |
| 6,373,618 B1 | 4/2002 | Agrawal et al. |
| 6,407,847 B1 | 6/2002 | Poll et al. |
| 6,466,298 B1 | 10/2002 | Fix et al. |
| 6,486,928 B1 | 11/2002 | Lin et al. |
| 6,567,708 B1 | 5/2003 | Bechtel et al. |
| 6,589,613 B1 | 7/2003 | Kunert |
| 6,594,067 B2 | 7/2003 | Poll et al. |
| 6,621,534 B2 | 9/2003 | Lin et al. |
| 6,639,708 B2 | 10/2003 | Elkadi et al. |
| 6,643,050 B2 | 11/2003 | Rukavina et al. |
| 6,671,008 B1 | 12/2003 | Li et al. |
| 6,671,080 B2 | 12/2003 | Poll et al. |
| 6,795,226 B2 | 9/2004 | Agrawal et al. |
| 6,819,467 B2 | 11/2004 | Lynam |
| 6,829,074 B2 | 12/2004 | Terada et al. |
| 6,829,511 B2 | 12/2004 | Bechtel et al. |
| 6,842,276 B2 | 1/2005 | Poll et al. |
| 6,950,221 B1 | 9/2005 | Terada et al. |
| 7,002,720 B2 | 2/2006 | Beteille et al. |
| 7,009,665 B2 | 3/2006 | Li et al. |
| 7,023,600 B2 | 4/2006 | Mallya et al. |
| 7,033,655 B2 | 4/2006 | Beteille et al. |
| 7,081,929 B2 | 7/2006 | Furuki et al. |
| 7,085,609 B2 | 8/2006 | Bechtel et al. |
| 7,173,750 B2 | 2/2007 | Rukavina |
| 7,230,748 B2 | 6/2007 | Giron et al. |
| 7,300,166 B2 | 11/2007 | Agrawal et al. |
| 7,423,664 B2 | 9/2008 | Ukawa |
| 7,502,156 B2 | 3/2009 | Tonar et al. |
| 7,505,188 B2 | 3/2009 | Niiyama et al. |
| 7,525,714 B2 | 4/2009 | Poll et al. |
| 7,542,809 B2 | 6/2009 | Bechtel et al. |
| 7,671,948 B2 | 3/2010 | Ninomiya |
| 7,719,751 B2 | 5/2010 | Egerton et al. |
| 7,738,155 B2 | 6/2010 | Agrawal et al. |
| 7,746,534 B2 | 6/2010 | Tonar et al. |
| 7,817,327 B2 | 10/2010 | Derda |
| 7,822,490 B2 | 10/2010 | Bechtel et al. |
| 7,872,791 B2 | 1/2011 | Karmhag et al. |
| 7,876,400 B2 | 1/2011 | Baliga et al. |
| 7,906,203 B2 | 3/2011 | Hartig |
| 7,960,854 B2 | 6/2011 | Paulus et al. |
| 7,990,603 B2 | 8/2011 | Ash et al. |
| 8,102,478 B2 | 1/2012 | Xue |
| 8,164,818 B2 | 4/2012 | Collins et al. |
| 8,169,587 B2 | 5/2012 | Bolton |
| 8,187,682 B2 | 5/2012 | Albrecht et al. |
| 8,189,254 B2 | 5/2012 | Voss et al. |
| 8,199,264 B2 | 6/2012 | Veerasamy |
| 8,213,074 B1 | 7/2012 | Shrivastava et al. |
| 8,218,224 B2 | 7/2012 | Kwak et al. |
| 8,219,217 B2 | 7/2012 | Bechtel et al. |
| 8,263,228 B2 | 9/2012 | Torr |
| 8,289,609 B2 | 10/2012 | Lamine et al. |
| 8,343,571 B2 | 1/2013 | Werners et al. |
| 8,355,112 B2 | 1/2013 | Bolton |
| 8,482,838 B2 | 7/2013 | Sbar et al. |
| 8,547,624 B2 | 10/2013 | Ash et al. |
| 8,551,603 B2 | 10/2013 | Thompson |
| 8,610,992 B2 | 12/2013 | Varaprasad et al. |
| 8,619,204 B2 | 12/2013 | Saitoh et al. |
| 8,643,933 B2 | 2/2014 | Brown |
| 8,711,465 B2 | 4/2014 | Bhatnagar et al. |
| 8,810,889 B2 | 8/2014 | Brown |
| 8,869,493 B2 | 10/2014 | Chubb et al. |
| 8,913,215 B2 | 12/2014 | Yang et al. |
| 8,941,788 B2 | 1/2015 | Brecht et al. |
| 8,970,810 B2 | 3/2015 | Bowser et al. |
| 8,975,789 B2 | 3/2015 | Snyker et al. |
| 8,995,039 B2 | 3/2015 | Bartug et al. |
| 9,019,588 B2 | 4/2015 | Brown et al. |
| 9,036,242 B2 | 5/2015 | Bergh et al. |
| 9,091,868 B2 | 7/2015 | Bergh et al. |
| 9,097,842 B2 | 8/2015 | Van Nutt et al. |
| 9,102,124 B2 | 8/2015 | Collins et al. |
| 9,128,346 B2 | 9/2015 | Shrivastava et al. |
| 9,158,173 B2 | 10/2015 | Bhatnagar et al. |
| 9,176,357 B2 | 11/2015 | Lam et al. |
| 9,193,135 B2 | 11/2015 | Boote et al. |
| 9,316,883 B2 | 4/2016 | Sbar et al. |
| 9,333,728 B2 | 5/2016 | Veerasamy |
| 9,341,015 B2 | 5/2016 | Fernando et al. |
| 9,341,909 B2 | 5/2016 | Egerton et al. |
| 9,389,454 B2 | 7/2016 | Yamaguchi et al. |
| 9,400,411 B2 | 7/2016 | Poix et al. |
| 9,436,054 B2 | 9/2016 | Brown et al. |
| 9,436,055 B2 | 9/2016 | Shrivastava et al. |
| 9,442,341 B2 | 9/2016 | Shrivastava et al. |
| 9,477,130 B2 | 10/2016 | Dubrenat et al. |
| 9,494,717 B2 | 11/2016 | Reymond et al. |
| 9,550,457 B2 | 1/2017 | Green et al. |
| 9,568,799 B2 | 2/2017 | Lam et al. |
| 9,581,877 B2 | 2/2017 | Bass et al. |

(56) References Cited

U.S. PATENT DOCUMENTS

| | | |
|---|---|---|
| 9,606,411 B2 | 3/2017 | Bergh et al. |
| 9,606,412 B2 | 3/2017 | Geerlings et al. |
| 9,618,819 B2 | 4/2017 | Egerton et al. |
| 9,618,820 B2 | 4/2017 | Conklin et al. |
| 9,625,783 B2 | 4/2017 | Bjornard et al. |
| 9,664,976 B2 | 5/2017 | Rozbicki |
| 9,690,162 B2 | 6/2017 | Wilbur et al. |
| 9,701,577 B1 | 7/2017 | Simmons |
| 9,726,925 B2 | 8/2017 | Relot et al. |
| 9,766,496 B2 | 9/2017 | Cammenga et al. |
| 9,810,963 B2 | 11/2017 | Gauthier et al. |
| 9,829,763 B2 | 11/2017 | Friedman et al. |
| 9,857,657 B2 | 1/2018 | Ash et al. |
| 9,891,454 B2 | 2/2018 | Zhang et al. |
| 9,927,609 B2 | 3/2018 | Cammenga et al. |
| 9,939,702 B2 | 4/2018 | Bjornard |
| 9,952,481 B2 | 4/2018 | Rozbicki et al. |
| 9,958,750 B2 | 5/2018 | Parker et al. |
| 9,958,751 B2 | 5/2018 | Bergh et al. |
| 9,963,383 B2 | 5/2018 | Veerasamy |
| 9,971,194 B2 | 5/2018 | Brecht et al. |
| 9,989,822 B2 | 6/2018 | Galstian |
| 11,100,845 B1* | 8/2021 | Kim .................. G09G 3/3233 |
| 2003/0214695 A1 | 11/2003 | Pullen et al. |
| 2004/0233379 A1 | 11/2004 | Kinoshita et al. |
| 2005/0002081 A1 | 1/2005 | Beteille et al. |
| 2005/0046920 A1 | 3/2005 | Freeman et al. |
| 2005/0132558 A1 | 6/2005 | Hennessy et al. |
| 2005/0233125 A1 | 10/2005 | Anderson et al. |
| 2008/0089073 A1 | 4/2008 | Hikmet |
| 2008/0291339 A1 | 11/2008 | Mamba et al. |
| 2008/0317977 A1 | 12/2008 | Wu |
| 2009/0246426 A1 | 10/2009 | Wu |
| 2009/0279004 A1 | 11/2009 | Greenall et al. |
| 2009/0303565 A1 | 12/2009 | Karmhag et al. |
| 2010/0028585 A1 | 2/2010 | Shimatani |
| 2010/0279125 A1 | 11/2010 | Buyuktanir et al. |
| 2011/0007253 A1 | 1/2011 | Stocq |
| 2011/0181820 A1 | 7/2011 | Watanabe |
| 2012/0086904 A1 | 4/2012 | Oki et al. |
| 2012/0094118 A1 | 4/2012 | Oki et al. |
| 2012/0113167 A1 | 5/2012 | Margerm et al. |
| 2012/0218175 A1 | 8/2012 | Uemura et al. |
| 2012/0239209 A1 | 9/2012 | Brown et al. |
| 2012/0327499 A1* | 12/2012 | Parker ............... B32B 17/10917 359/275 |
| 2013/0107563 A1 | 5/2013 | Mccabe et al. |
| 2013/0118918 A1 | 5/2013 | Servida |
| 2013/0265511 A1 | 10/2013 | Poix et al. |
| 2013/0271813 A1 | 10/2013 | Brown |
| 2013/0271814 A1 | 10/2013 | Brown |
| 2014/0020851 A1 | 1/2014 | Ouzts et al. |
| 2014/0204294 A1 | 7/2014 | Lv |
| 2014/0211129 A1 | 7/2014 | Bowser et al. |
| 2014/0247475 A1 | 9/2014 | Parker et al. |
| 2015/0002919 A1 | 1/2015 | Jack et al. |
| 2015/0049270 A1 | 2/2015 | Zhang et al. |
| 2015/0049378 A1 | 2/2015 | Shrivastava et al. |
| 2015/0103389 A1 | 4/2015 | Klawuhn et al. |
| 2015/0116649 A1 | 4/2015 | Watanabe |
| 2015/0118869 A1 | 4/2015 | Brown et al. |
| 2015/0151613 A1 | 6/2015 | Weng |
| 2015/0219975 A1 | 8/2015 | Phillips et al. |
| 2015/0277165 A1 | 10/2015 | Burrows et al. |
| 2015/0346575 A1 | 12/2015 | Bhatnagar et al. |
| 2015/0370140 A1 | 12/2015 | Bertolini |
| 2015/0378189 A1 | 12/2015 | Kim et al. |
| 2016/0026061 A1 | 1/2016 | O'Keeffe |
| 2016/0085129 A1 | 3/2016 | Cammenga et al. |
| 2016/0085131 A1 | 3/2016 | Lam et al. |
| 2016/0096344 A1 | 4/2016 | Kurihara |
| 2016/0097960 A1 | 4/2016 | Dixit et al. |
| 2016/0124283 A1 | 5/2016 | Brown et al. |
| 2016/0124284 A1 | 5/2016 | O'Keeffe |
| 2016/0133196 A1 | 5/2016 | Emelie et al. |
| 2016/0138328 A1 | 5/2016 | Behmke et al. |
| 2016/0161818 A1 | 6/2016 | Gregard et al. |
| 2016/0187753 A1 | 6/2016 | Sbar et al. |
| 2016/0243773 A1 | 8/2016 | Wang |
| 2016/0259225 A1 | 9/2016 | Paolini, Jr. et al. |
| 2016/0312523 A1 | 10/2016 | Miyasaka et al. |
| 2016/0349590 A1 | 12/2016 | Hasegawa et al. |
| 2016/0363831 A1 | 12/2016 | Ash et al. |
| 2016/0377951 A1 | 12/2016 | Harris |
| 2017/0028686 A1 | 2/2017 | Wilson et al. |
| 2017/0075323 A1 | 3/2017 | Shrivastava et al. |
| 2017/0097553 A1 | 4/2017 | Jack et al. |
| 2017/0122028 A1 | 5/2017 | Suzuka et al. |
| 2017/0139302 A1 | 5/2017 | Tonar |
| 2017/0152702 A1 | 6/2017 | Chang et al. |
| 2017/0218686 A1 | 8/2017 | Galstian |
| 2017/0219908 A1 | 8/2017 | Brown et al. |
| 2017/0328121 A1 | 11/2017 | Purdy et al. |
| 2017/0371218 A1 | 12/2017 | Kailasam et al. |
| 2018/0011383 A1 | 1/2018 | Higashihara et al. |
| 2018/0095337 A1 | 4/2018 | Rozbicki et al. |
| 2018/0101080 A1 | 4/2018 | Gauthier et al. |
| 2018/0173030 A1 | 6/2018 | Li |
| 2018/0224689 A1* | 8/2018 | DeMiglio ............ G02F 1/13392 |
| 2018/0259804 A1 | 9/2018 | Bae et al. |
| 2018/0307111 A1 | 10/2018 | Le Houx et al. |
| 2019/0018298 A1 | 1/2019 | Engfeldt et al. |
| 2019/0041668 A1 | 2/2019 | Neic et al. |
| 2019/0137796 A1 | 5/2019 | Bjergaard et al. |
| 2019/0346710 A1 | 11/2019 | Schleder et al. |
| 2019/0377218 A1 | 12/2019 | Liu et al. |
| 2020/0057346 A1 | 2/2020 | Zedlitz et al. |
| 2020/0118480 A1 | 4/2020 | Paolini, Jr. et al. |
| 2021/0208436 A1 | 7/2021 | Wang et al. |

FOREIGN PATENT DOCUMENTS

| | | |
|---|---|---|
| CN | 102473382 A | 5/2012 |
| CN | 102592548 A | 7/2012 |
| CN | 203858432 U | 10/2014 |
| CN | 104820383 A | 8/2015 |
| CN | 105044965 A | 11/2015 |
| CN | 105334656 A | 2/2016 |
| CN | 205176432 U | 4/2016 |
| CN | 104948080 B | 6/2016 |
| CN | 205297172 U | 6/2016 |
| CN | 205558664 U | 9/2016 |
| CN | 106125444 A | 11/2016 |
| CN | 206035269 U | 3/2017 |
| CN | 206352460 U | 7/2017 |
| CN | 107077040 A | 8/2017 |
| CN | 107288492 A | 10/2017 |
| CN | 107327250 A | 11/2017 |
| CN | 206737720 U | 12/2017 |
| CN | 206801372 U | 12/2017 |
| CN | 206848627 U | 1/2018 |
| CN | 207004397 U | 2/2018 |
| EP | 978620 A2 | 2/2000 |
| EP | 2093051 A1 | 8/2009 |
| EP | 2256545 A1 | 12/2010 |
| EP | 2860580 A1 | 4/2015 |
| GB | 2546987 A | 8/2017 |
| JP | 62071930 A | 4/1987 |
| JP | H01202713 A | 8/1989 |
| JP | 2001004971 A | 1/2001 |
| JP | 2004182484 A | 7/2004 |
| JP | 2006053551 A | 2/2006 |
| JP | 2016218431 A | 12/2016 |
| JP | 2017068196 A | 4/2017 |
| JP | 6135793 B1 | 5/2017 |
| JP | 2019502938 A | 1/2019 |
| JP | 2019503510 A | 2/2019 |
| KR | 1020130037600 A | 4/2013 |
| KR | 1020160037226 A | 4/2016 |
| KR | 1020190027956 A | 3/2019 |
| TW | 201423245 A | 6/2014 |
| TW | 201619952 A | 6/2016 |
| WO | 2005084378 A2 | 9/2005 |
| WO | 2008090438 A2 | 7/2008 |

(56) References Cited

FOREIGN PATENT DOCUMENTS

| | | |
|---|---|---|
| WO | 2010100807 A1 | 9/2010 |
| WO | 2012111715 A1 | 8/2012 |
| WO | 2013155612 A1 | 10/2013 |
| WO | 2014032023 A1 | 2/2014 |
| WO | 2015059029 A1 | 4/2015 |
| WO | 2015100419 A1 | 7/2015 |
| WO | 2015117736 A1 | 8/2015 |
| WO | 2016008375 A1 | 1/2016 |
| WO | 2016043164 A1 | 3/2016 |
| WO | 2017008881 A1 | 1/2017 |
| WO | 2017011268 A1 | 1/2017 |
| WO | 2017062639 A1 | 4/2017 |
| WO | 2017183692 A1 | 10/2017 |
| WO | 2017189307 A2 | 11/2017 |
| WO | 2018009645 A1 | 1/2018 |
| WO | 2018086400 A1 | 5/2018 |

OTHER PUBLICATIONS

International Patent Application No. PCT/US2020/030364, International Search Report and Written Opinion dated Jun. 24, 2020, 14 pages.

* cited by examiner

|  | Low Resistance | High Resistance |
|---|---|---|
| High Capacitance | <ul><li>e.g., large structure with busbar contacts</li><li>Max current regulator</li><li>Slew-rate square wave</li><li>PWM (rail voltage pulse)</li></ul> | <ul><li>e.g., large structure with point contacts</li><li>Square wave</li><li>Overdrive portion of square wave (e.g., higher voltage) to fill capacitance quickly</li><li>Reduce frequency</li></ul> |
| Low Capacitance | <ul><li>e.g., small structure with busbar contacts</li><li>Max current regulator</li><li>Slew-rate square wave</li><li>PWM (rail voltage pulse)</li><li>Reduce frequency</li></ul> | <ul><li>e.g., small structure with point contacts</li><li>Slew-rate square wave</li><li>Reduce frequency</li></ul> |

FIG. 8

LEAKAGE CURRENT DETECTION AND CONTROL FOR ONE OR MORE ELECTRICALLY CONTROLLABLE PRIVACY GLAZING STRUCTURES

RELATED MATTERS

This application is a divisional of U.S. patent application Ser. No. 17/739,443, filed May 9, 2022, which is a divisional of U.S. patent application Ser. No. 16/861,388, filed Apr. 29, 2020 and issued as U.S. Pat. No. 11,325,352 on May 10, 2022, which claims the benefit of U.S. Provisional Patent Application No. 62/840,038, filed Apr. 29, 2019. The entire contents of each of these applications are incorporated herein by reference.

TECHNICAL FIELD

This disclosure relates to structures that include an electrically controllable optically active material and, more particularly, to drivers for controlling the electrically controllable optically active material.

BACKGROUND

Windows, doors, partitions, and other structures having controllable light modulation have been gaining popularity in the marketplace. These structures are commonly referred to as "smart" structures or "privacy" structures for their ability to transform from a transparent state in which a user can see through the structure to a private state in which viewing is inhibited through the structure. For example, smart windows are being used in high-end automobiles and homes and smart partitions are being used as walls in office spaces to provide controlled privacy and visual darkening.

A variety of different technologies can be used to provide controlled optical transmission for a smart structure. For example, electrochromic technologies, photochromic technologies, thermochromic technologies, suspended particle technologies, and liquid crystal technologies are all being used in different smart structure applications to provide controllable privacy. The technologies generally use an energy source, such as electricity, to transform from a transparent state to a privacy state or vice versa.

In practice, an electrical driver may be used to control or "drive" the optically active material. The driver may apply or cease applying electrical energy to the optically active material to transition between a transparent state and privacy state, or vice versa. In addition, the driver may apply an electrical signal to the optically active material once transitioned in a particular state to help maintain that state. For example, the driver may apply an electrical signal of alternating polarity to the optically active material to transition the optically active material between states and/or maintain the optically active material in a transitioned stated.

In some cases, one or more changing characteristics in a structure including an electrically controllable optically active material render a previously-suitable electrical drive signal for controlling the optical state of the structure less suitable for the new characteristics of the structure. For example, changing electrical and/or chemical characteristics of the structure can change the optical response of the structure to a given electrical drive signal. This can lead to undesirable and/or unexpected optical properties of the electrically controllable optically active material in response to the drive signal. Additionally or alternatively, such changes can lead to operating inefficiencies, such as electrical inefficiency due to the electrical drive signal no longer being suitable for the characteristics of the structure.

SUMMARY

In general, this disclosure is directed to privacy structures incorporating an electrically controllable optically active material that provides controllable privacy. The privacy structures can be implemented in the form of a window, door, skylight, interior partition, or yet other structure where controllable visible transmittance is desired. In any case, the privacy structure may be fabricated from multiple panes of transparent material that include an electrically controllable medium between the panes. Each pane of transparent material can carry an electrode layer, which may be implemented as a layer of electrically conductive and optically transparent material deposited over the pane. The optically active material may be controlled, for example via an electrical driver communicatively coupled to the electrode layers, e.g., by controlling the application and/or removal of electrical energy to the optically active material. For example, the driver can control application and/or removal of electrical energy from the optically active material, thereby causing the optically active material to transition from a scattering state in which visibility through the structure is inhibited to a transparent state in which visibility through the structure is comparatively clear.

The electrical driver, which may also be referred to as a controller, may be designed to receive power from a power source, such as a rechargeable and/or replaceable battery and/or wall or mains power source. The electrical driver can condition the electricity received from the power source, e.g., by changing the frequency, amplitude, waveform, and/or other characteristic of the electricity received from the power source. The electrical driver can deliver the conditioned electrical signal to electrodes that are electrically coupled to the optically active material. In addition, in response to a user input or other control information, the electrical driver may change the conditioned electrical signal delivered to the electrodes and/or cease delivering electricity to the electrodes. Accordingly, the electrical driver can control the electrical signal delivered to the optically active material, thereby controlling the material to maintain a specific optical state or to transition from one state (e.g., a transparent state or scattering state) to another state.

Some aspects of the instant disclosure are directed toward systems and methods for or otherwise capable of assessing and adapting to changing characteristics of an electrically controllable optical privacy glazing structure. Some aspects of the instant disclosure involve measuring an electrical characteristic of a privacy glazing structure indicative of a health of the privacy glazing structure at a first time and measuring the electrical characteristic of the privacy glazing structure indicative of the health of the privacy glazing structure at a second time later than the first time.

A detected change in the electrical characteristic can indicate a change in the health of a privacy glazing structure. In some embodiments, at least one parameter of an electrical drive signal provided to the privacy glazing structure can be adjusted to compensate for the change in the health of the privacy glazing structure. In some examples, adjusting a parameter of the electrical drive signal includes increasing a voltage, decreasing a frequency, pulsing a voltage, or combinations thereof.

In some examples, a leakage current value associated with a privacy glazing structure can be determined, and adjusting at least one parameter of the drive signal is performed if the determined leakage current satisfies a predetermined condition.

Additionally or alternatively, the electrical characteristic of the privacy glazing structure indicative of the health of the privacy glazing structure can be measured at a plurality of additional times later than the second time and the measured characteristic at each of the plurality of times can be compared to the electrical characteristic measured at the first time. In some such examples, if, at any of the plurality of times, the electrical characteristic differs from the electrical characteristic at the first time by more than a threshold amount, at least one parameter of the electrical drive signal can be adjusted.

In some examples, observing changes in one or more electrical characteristics of a privacy glazing structure can indicate changing health conditions of the privacy glazing structure, such as changing chemical or electrical properties (e.g., due to damage or degradation). In some such embodiments, updating the electrical drive signal in response to detected changes can help maintain appropriate electrical drive signals or changing structure characteristics.

BRIEF DESCRIPTION OF DRAWINGS

FIG. 8 shows an exemplary categorization of electrical characterizations of different privacy glazing structures and corresponding electrical drive signal parameters.

FIGS. and 10A and 10B show exemplary drive signal and resulting response current signal over time for a privacy glazing structure.

Figure 10A:
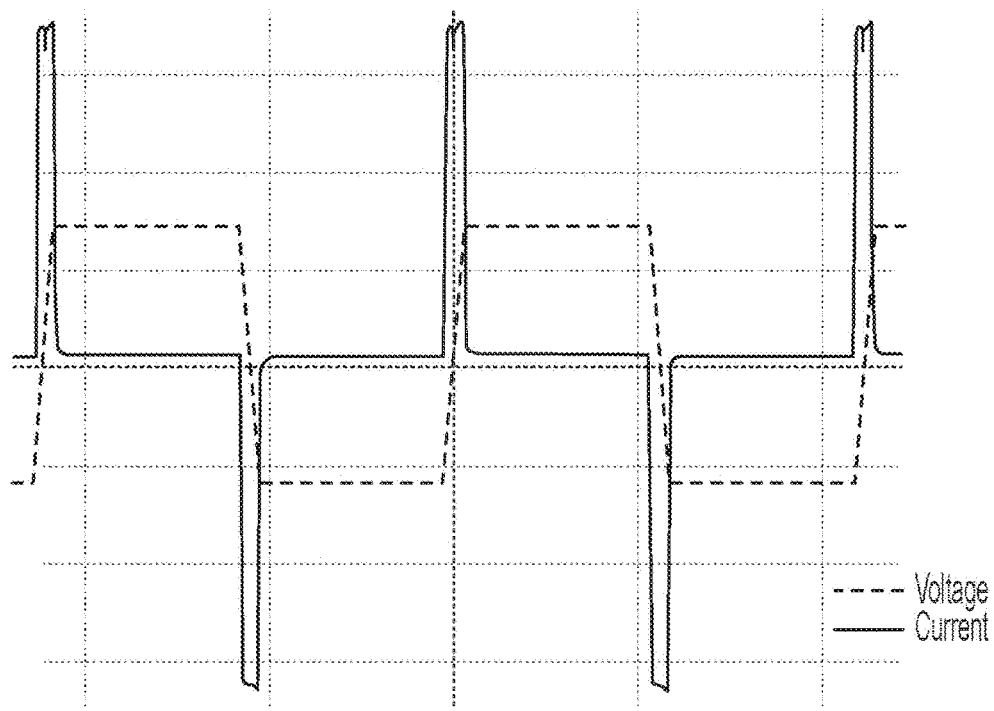
Figure 10B:
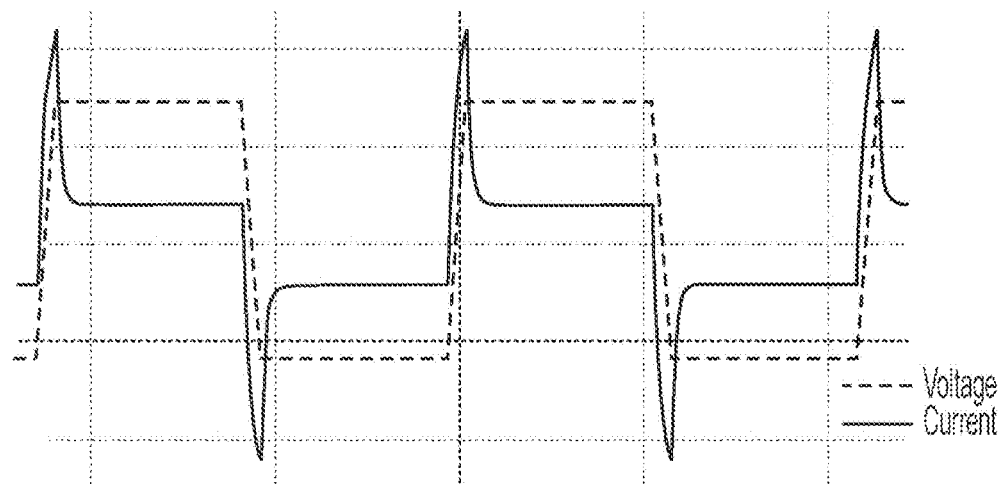
Figure 11A:
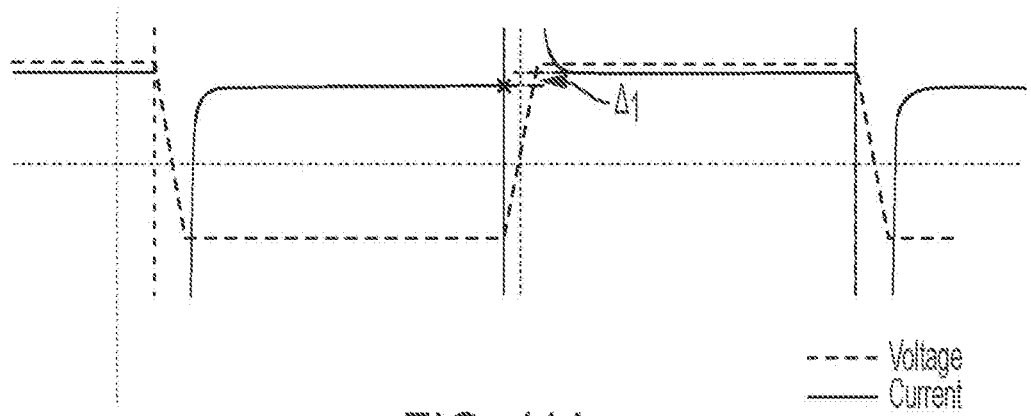
Figure 11B:
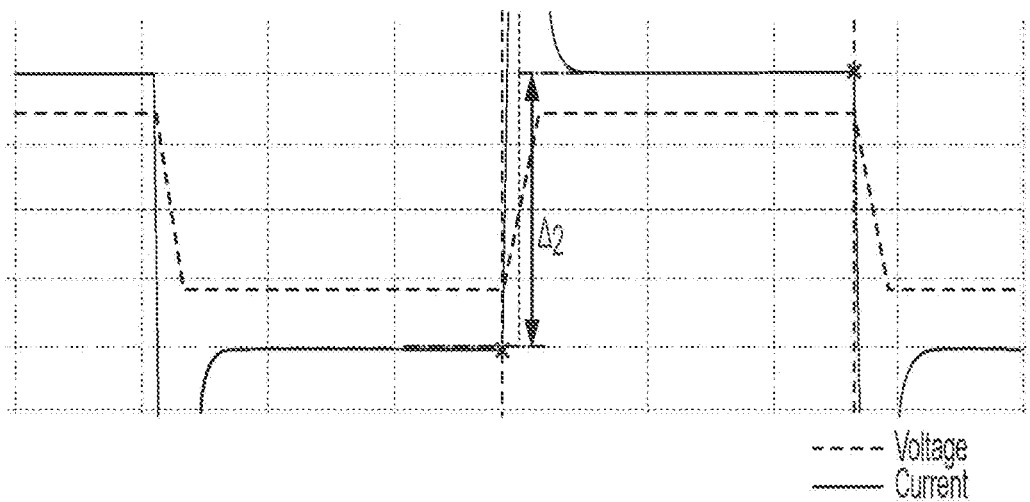

FIGS. 11A and 11B show zoomed-in views of the exemplary current and voltage signals of FIGS. 10A and 10B, respectively, including different display scales for ease of display.

Figure 12:
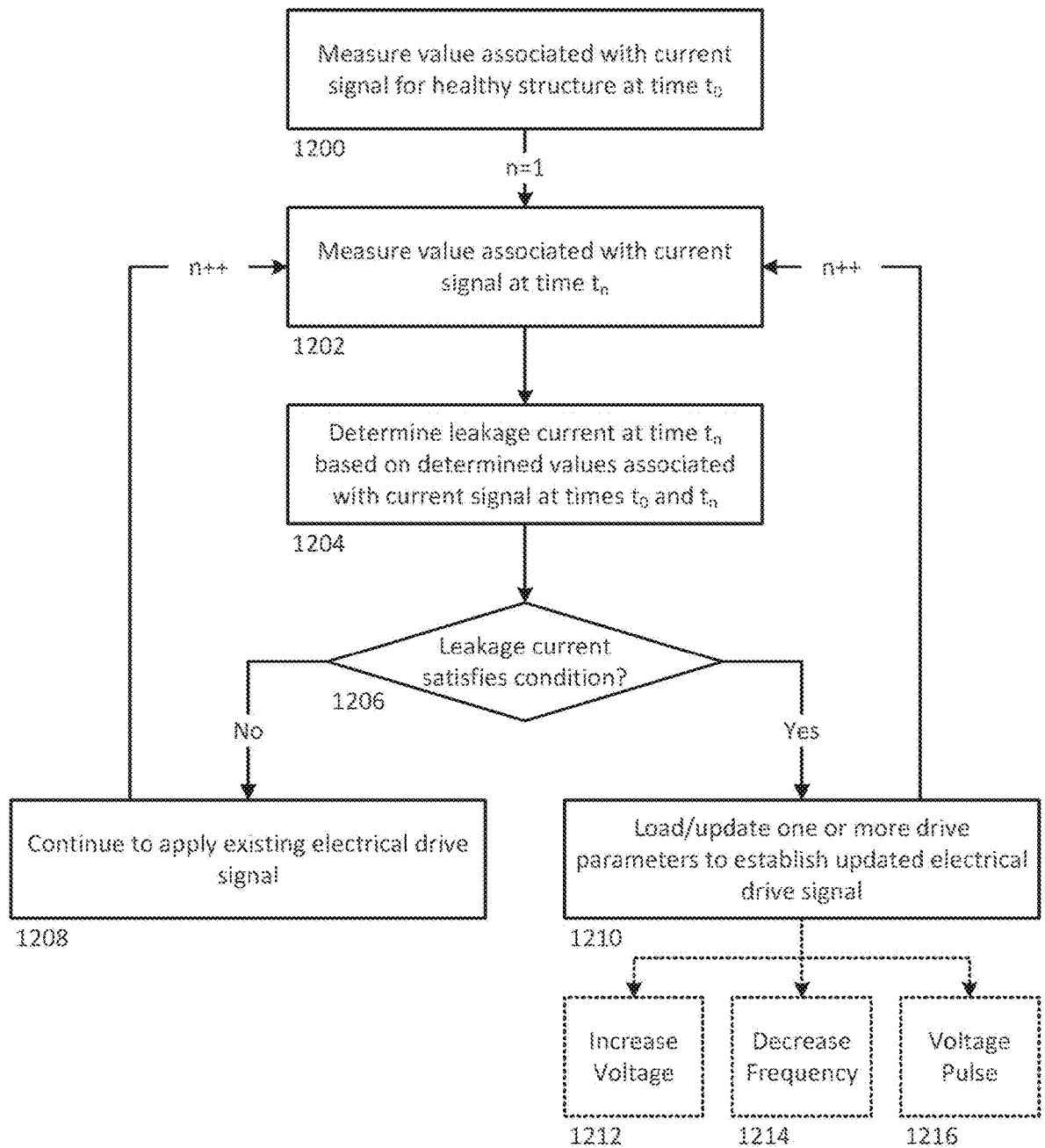

FIG. 12 shows a process flow diagram showing an exemplary process for determining one or more leakage current values.

Figure 13:
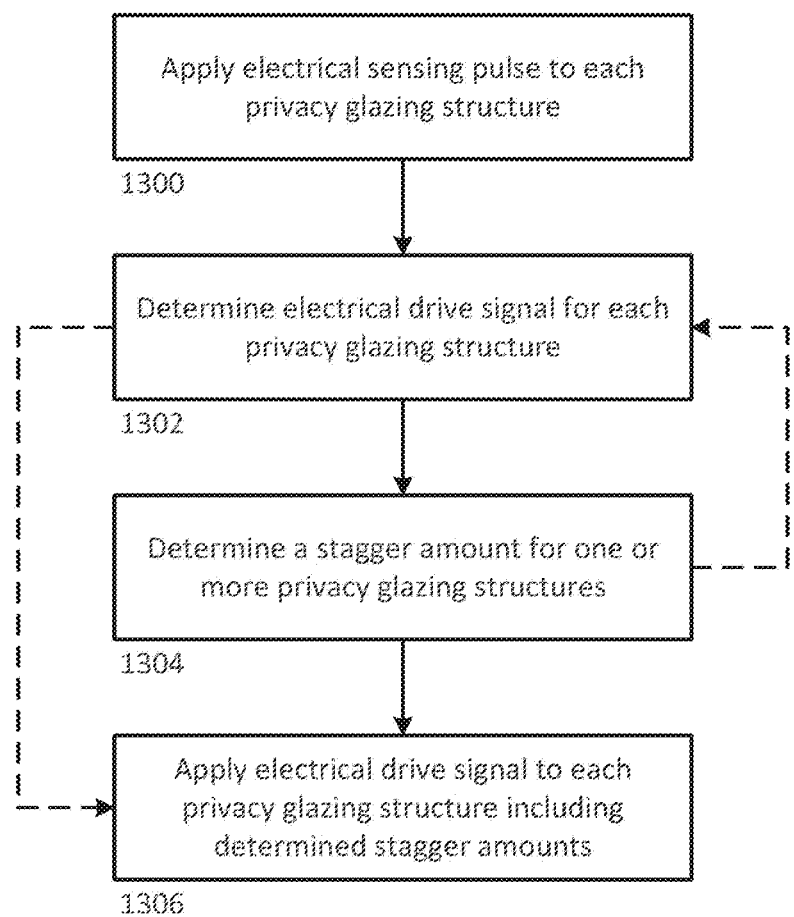

FIG. 13 shows a process flow diagram showing an example process for applying staggered electrical drive signals to a plurality of privacy glazing structures.

Figure 14:
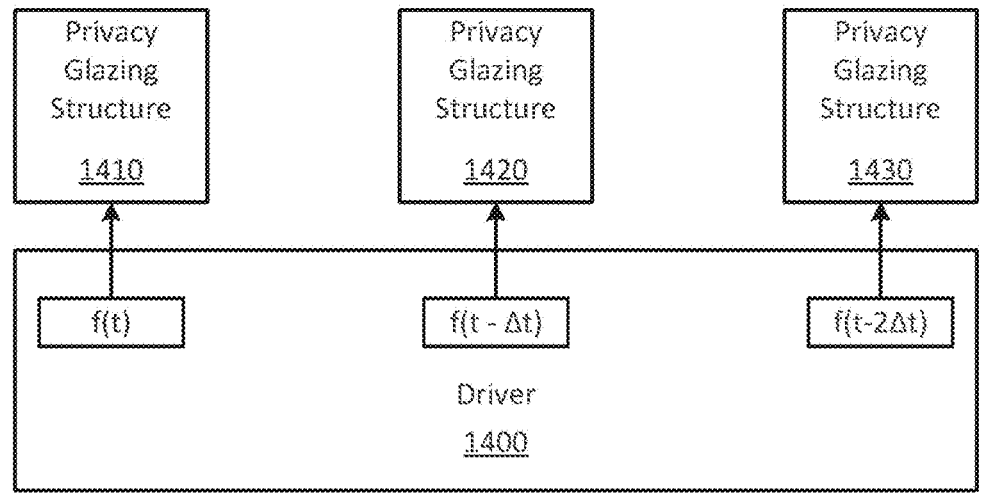

FIG. 14 shows an example implementation of applying electrical drive signals including determined amounts of stagger to a plurality of privacy glazing structures.

Figure 15:
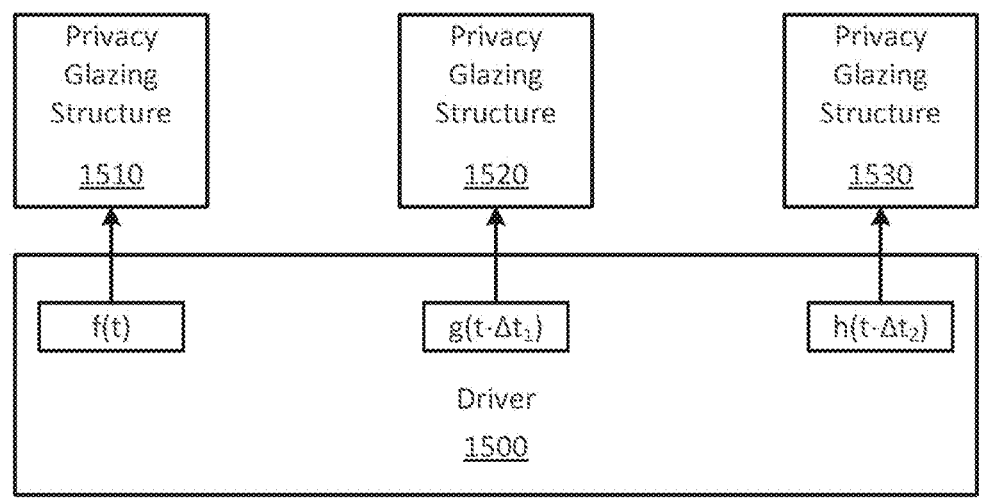

FIG. 15 shows an example implementation of applying electrical drive signals including determined amounts of stagger to a plurality of privacy glazing structures.

Figure 16A:
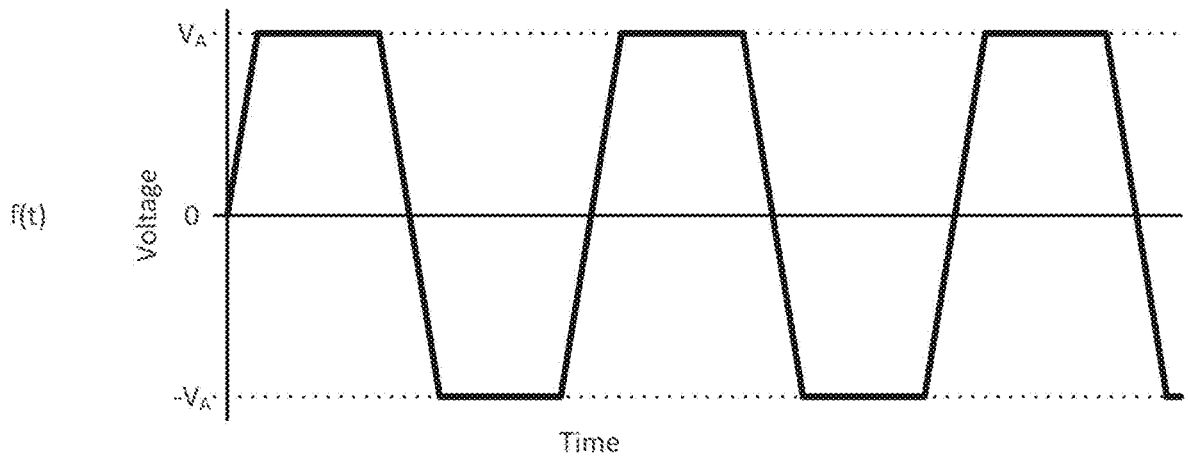
Figure 16B:
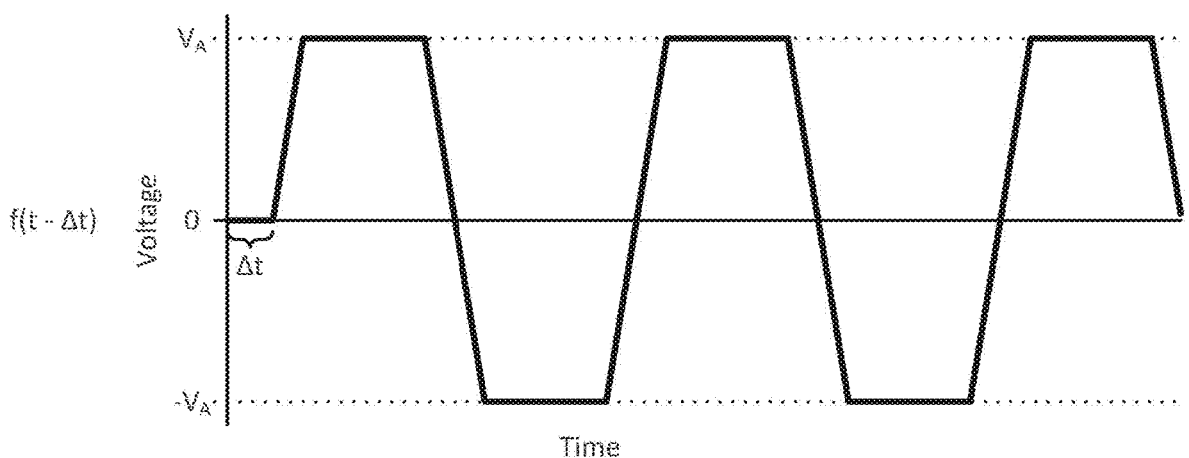
Figure 16C:
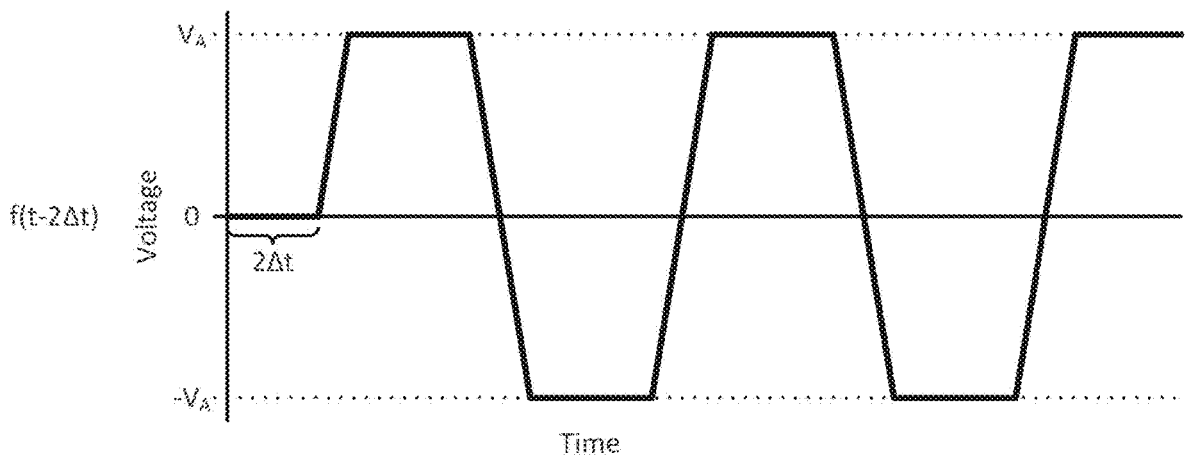

FIGS. 16A-16C show example voltage vs. time profiles for a plurality of electrical drive signals used to drive a corresponding plurality of privacy glazing structures in a system.

DETAILED DESCRIPTION

In general, the present disclosure is directed to electrical control systems, devices, and method for controlling optical structures having controllable light modulation. For example, an optical structure may include an electrically controllable optically active material that provides controlled transition between a privacy or scattering state and a visible or transmittance state. An electrical controller, or driver, may be electrically coupled to optically active material through electrode layers bounding the optically active material. The electrical driver may receive power from a power source and condition the electricity received from the power source, e.g., by changing the frequency, amplitude, waveform, and/or other characteristic of the electricity received from the power source. The electrical driver can deliver the conditioned electrical signal to the electrodes. In addition, in response to a user input or other control information, the electrical driver may change the conditioned electrical signal delivered to the electrodes and/or cease delivering electricity to the electrodes. Accordingly, the electrical driver can control the electrical signal delivered to the optically active material, thereby controlling the material to maintain a specific optical state or to transition from one state (e.g., a transparent state or scattering state) to another state.

Example electrical driver configurations and electrical control features are described in greater detail with FIGS. 3-10. However, FIGS. 1 and 2 first describe example privacy structures that may utilize an electrical driver arrangement and electrical control features as described herein.

Figure 1:
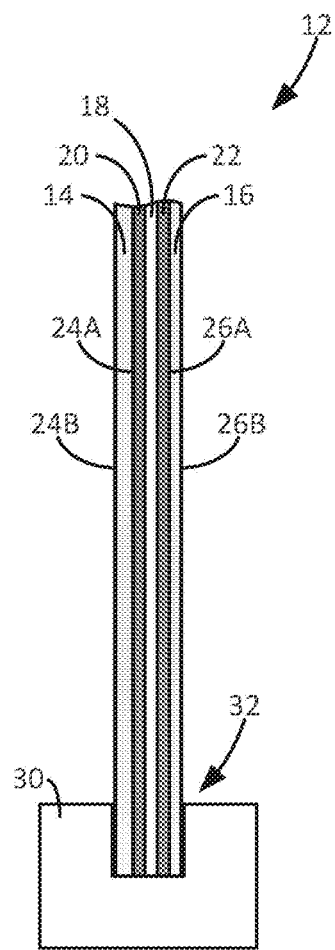
FIG. 1 is a side view of an example privacy glazing structure.

FIG. 1 is a side view of an example privacy glazing structure 12 that includes a first pane of transparent material 14 and a second pane of transparent material 16 with a layer of optically active material 18 bounded between the two panes of transparent material. The privacy glazing structure 12 also includes a first electrode layer 20 and a second electrode layer 22. The first electrode layer 20 is carried by the first pane of transparent material 14 while the second electrode layer 22 is carried by the second pane of transparent material. In operation, electricity supplied through the first and second electrode layers 20, 22 can control the optically active material 18 to control visibility through the privacy glazing structure.

Privacy glazing structure 12 can utilize any suitable privacy materials for the layer of optically active material 18. Further, although optically active material 18 is generally illustrated and described as being a single layer of material, it should be appreciated that a structure in accordance with the disclosure can have one or more layers of optically active material with the same or varying thicknesses. In general, optically active material 18 is configured to provide controllable and reversible optical obscuring and lightening. Optically active material 18 can be an electronically controllable optically active material that changes direct visible transmittance in response to changes in electrical energy applied to the material.

In one example, optically active material 18 is formed of an electrochromic material that changes opacity and, hence, light transmission properties, in response to voltage changes applied to the material. Typical examples of electrochromic materials are $WO_3$ and $MoO_3$, which are usually colorless when applied to a substrate in thin layers. An electrochromic layer may change its optical properties by oxidation or reduction processes. For example, in the case of tungsten oxide, protons can move in the electrochromic layer in response to changing voltage, reducing the tungsten oxide to blue tungsten bronze. The intensity of coloration is varied by the magnitude of charge applied to the layer.

In another example, optically active material 18 is formed of a liquid crystal material. Different types of liquid crystal materials that can be used as optically active material 18 include polymer dispersed liquid crystal (PDLC) materials and polymer stabilized cholesteric texture (PSCT) materials. Polymer dispersed liquid crystals usually involve phase separation of nematic liquid crystal from a homogeneous liquid crystal containing an amount of polymer, sandwiched between electrode layers 20 and 22. When the electric field is off, the liquid crystals may be randomly scattered. This scatters light entering the liquid crystal and diffuses the transmitted light through the material. When a certain voltage is applied between the two electrode layers, the liquid crystals may homeotropically align and the liquid crystals increase in optical transparency, allowing light to transmit through the crystals.

In the case of polymer stabilized cholesteric texture (PSCT) materials, the material can either be a normal mode polymer stabilized cholesteric texture material or a reverse mode polymer stabilized cholesteric texture material. In a normal polymer stabilized cholesteric texture material, light is scattered when there is no electrical field applied to the material. If an electric field is applied to the liquid crystal, it turns to the homeotropic state, causing the liquid crystals to reorient themselves parallel in the direction of the electric field. This causes the liquid crystals to increase in optical transparency and allows light to transmit through the liquid crystal layer. In a reverse mode polymer stabilized cholesteric texture material, the liquid crystals are transparent in the absence of an electric field (e.g., zero electric field) but opaque and scattering upon application of an electric field.

In one example in which the layer of optically active material 18 is implemented using liquid crystals, the optically active material includes liquid crystals and a dichroic dye to provide a guest-host liquid crystal mode of operation. When so configured, the dichroic dye can function as a guest compound within the liquid crystal host. The dichroic dye can be selected so the orientation of the dye molecules follows the orientation of the liquid crystal molecules. In some examples, when an electric field is applied to the optically active material 18, there is little to no absorption in the short axis of the dye molecule, and when the electric field is removed from the optically active material, the dye molecules absorb in the long axis. As a result, the dichroic dye molecules can absorb light when the optically active material is transitioned to a scattering state. When so configured, the optically active material may absorb light impinging upon the material to prevent an observer on one side of privacy glazing structure 12 from clearly observing activity occurring on the opposite side of the structure.

When optically active material 18 is implemented using liquid crystals, the optically active material may include liquid crystal molecules within a polymer matrix. The polymer matrix may or may not be cured, resulting in a solid or liquid medium of polymer surrounding liquid crystal molecules. In addition, in some examples, the optically active material 18 may contain spacer beads (e.g., micro-spheres), for example having an average diameter ranging from 3 micrometers to 40 micrometers, to maintain separation between the first pane of transparent material 14 and the second pane of transparent material 16.

In another example in which the layer of optically active material 18 is implemented using a liquid crystal material, the liquid crystal material turns hazy when transitioned to the privacy state. Such a material may scatter light impinging upon the material to prevent an observer on one side of privacy glazing structure 12 from clearly observing activity occurring on the opposite side of the structure. Such a material may significantly reduce regular visible transmittance through the material (which may also be referred to as direct visible transmittance) while only minimally reducing total visible transmittance when in the privacy state, as compared to when in the light transmitting state. When using these materials, the amount of scattered visible light transmitting through the material may increase in the privacy state as compared to the light transmitting state, compensating for the reduced regular visible transmittance through the material. Regular or direct visible transmittance may be considered the transmitted visible light that is not scattered or redirected through optically active material 18.

Another type of material that can be used as the layer of optically active material 18 is a suspended particle material. Suspended particle materials are typically dark or opaque in a non-activated state but become transparent when a voltage is applied. Other types of electrically controllable optically active materials can be utilized as optically active material 18, and the disclosure is not limited in this respect.

Independent of the specific type of material(s) used for the layer of optically active material 18, the material can change from a light transmissive state in which privacy glazing structure 12 is intended to be transparent to a privacy state in which visibility through the insulating glazing unit is intended to be blocked. Optically active material 18 may exhibit progressively decreasing direct visible transmittance when transitioning from a maximum light transmissive state to a maximum privacy state. Similarly, optically active material 18 may exhibit progressively increasing direct visible transmittance when transitioning from a maximum privacy state to a maximum transmissive state. The speed at which optically active material 18 transitions from a generally transparent transmission state to a generally opaque privacy state may be dictated by a variety of factors, including the specific type of material selected for optically active material 18, the temperature of the material, the electrical voltage applied to the material, and the like.

To electrically control optically active material 18, privacy glazing structure 12 in the example of FIG. 1 includes first electrode layer 20 and second electrode layer 22. Each electrode layer may be in the form of an electrically conductive coating deposited on or over the surface of each respective pane facing the optically active material 18. For example, first pane of transparent material 14 may define an inner surface 24A and an outer surface 24B on an opposite side of the pane. Similarly, second pane of transparent material 16 may define an inner surface 26A and an outer surface 26B on an opposite side of the pane. First electrode layer 20 can be deposited over the inner surface 24A of the first pane, while second electrode layer 22 can be deposited over the inner surface 26A of the second pane. The first and second electrode layers 20, 22 can be deposited directed on the inner surface of a respective pane or one or more intermediate layers, such as a blocker layer, and be deposited between the inner surface of the pane and the electrode layer.

Each electrode layer 20, 22 may be an electrically conductive coating that is a transparent conductive oxide ("TCO") coating, such as aluminum-doped zinc oxide and/or tin-doped indium oxide. The transparent conductive oxide coatings can be electrically connected to a power source through notch structures as described in greater detail below. In some examples, the transparent conductive coatings forming electrode layers 20, 22 define wall surfaces of a cavity between first pane of transparent material 14 and second pane of transparent material 16 which optically active material 18 contacts. In other examples, one or more other coatings may overlay the first and/or second electrode layers 20, 22, such as a dielectric overcoat (e.g., silicon oxynitride). In either case, first pane of transparent material 14 and second pane of transparent material 16, as well as any coatings on inner faces 24A, 26A of the panes can form a cavity or chamber containing optically active material 18.

The panes of transparent material forming privacy glazing structure 12, including first pane 14 and second pane 16, and be formed of any suitable material. Each pane of transparent material may be formed from the same material, or at least one of the panes of transparent material may be formed of a material different than at least one other of the panes of transparent material. In some examples, at least one (and optionally all) the panes of privacy glazing structure 12 are formed of glass. In other examples, at least one (and optionally all) the privacy glazing structure 12 are formed of plastic such as, e.g., a fluorocarbon plastic, polypropylene, polyethylene, or polyester. When glass is used, the glass may be aluminum borosilicate glass, sodium-lime (e.g., sodium-lime-silicate) glass, or another type of glass. In addition, the glass may be clear or the glass may be colored, depending on the application. Although the glass can be manufactured using different techniques, in some examples the glass is manufactured on a float bath line in which molten glass is deposited on a bath of molten tin to shape and solidify the glass. Such an example glass may be referred to as float glass.

In some examples, first pane 14 and/or second pane 16 may be formed from multiple different types of materials. For example, the substrates may be formed of a laminated glass, which may include two panes of glass bonded together with a polymer such as polyvinyl butyral. Additional details on privacy glazing substrate arrangements that can be used in the present disclosure can be found in U.S. patent application Ser. No. 15/958,724, titled "HIGH PERFORMANCE PRIVACY GLAZING STRUCTURES" and filed Apr. 20, 2018, the entire contents of which are incorporated herein by reference.

Privacy glazing structure 12 can be used in any desired application, including in a door, a window, a wall (e.g., wall partition), a skylight in a residential or commercial building, or in other applications. To help facilitate installation of privacy glazing structure 12, the structure may include a frame 30 surrounding the exterior perimeter of the structure. In different examples, frame 30 may be fabricated from wood, metal, or a plastic material such a vinyl. Frame 30 may defines a channel 32 that receives and holds the external perimeter edge of structure 12.

Figure 2:
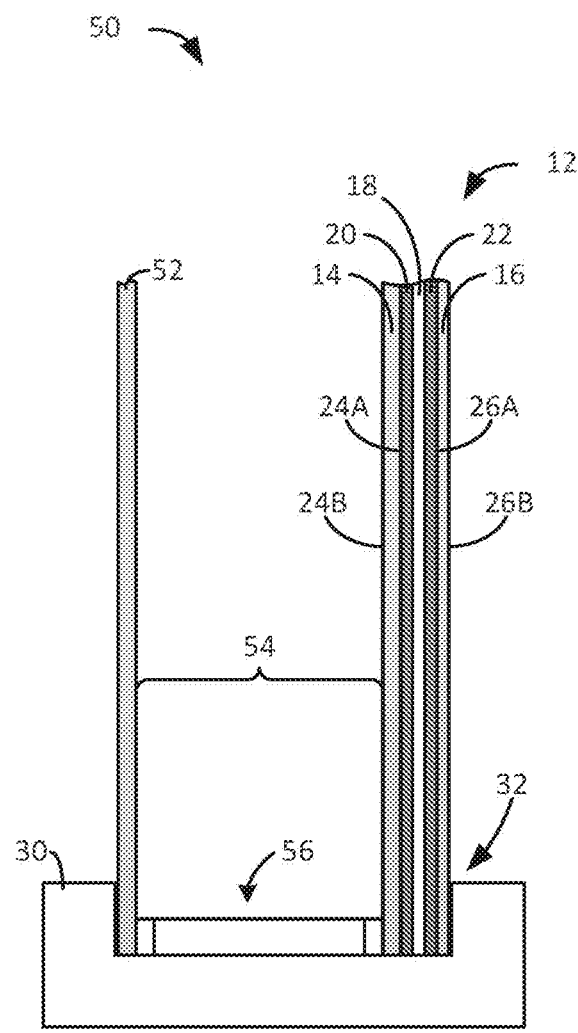
FIG. 2 is a side view of the example privacy glazing structure of FIG. 1 incorporated into a multi-pane insulating glazing unit.

In the example of FIG. 1, privacy glazing structure 12 is illustrated as a privacy cell formed of two panes of transparent material bounding optically active material 18. In other configurations, privacy glazing structure 12 may be incorporated into a multi-pane glazing structure that include a privacy cell having one or more additional panes separated by one or more between-pane spaces. FIG. 2 is a side view of an example configuration in which privacy glazing structure 12 from FIG. 1 is incorporated into a multi-pane insulating glazing unit having a between-pane space.

As shown in the illustrated example of FIG. 2, a multi-pane privacy glazing structure 50 may include privacy glazing structure 12 separated from an additional (e.g., third) pane of transparent material 52 by a between-pane space 54, for example, by a spacer 56. Spacer 56 may extend around the entire perimeter of multi-pane privacy glazing structure 50 to hermetically seal the between-pane space 54 from gas exchange with a surrounding environment. To minimize thermal exchange across multi-pane privacy glazing structure 50, between-pane space 54 can be filled with an insulative gas or even evacuated of gas. For example, between-pane space 54 may be filled with an insulative gas such as argon, krypton, or xenon. In such applications, the insulative gas may be mixed with dry air to provide a desired ratio of air to insulative gas, such as 10 percent air and 90 percent insulative gas. In other examples, between-pane space 54 may be evacuated so that the between-pane space is at vacuum pressure relative to the pressure of an environment surrounding multi-pane privacy glazing structure 50.

Spacer 56 can be any structure that holds opposed substrates in a spaced apart relationship over the service life of multi-pane privacy glazing structure 50 and seals between-pane space 54 between the opposed panes of material, e.g., so as to inhibit or eliminate gas exchange between the between-pane space and an environment surrounding the unit. One example of a spacer that can be used as spacer 56 is a tubular spacer positioned between first pane of transparent material 14 and third pane of transparent material 52. The tubular spacer may define a hollow lumen or tube which, in some examples, is filled with desiccant. The tubular spacer may have a first side surface adhered (by a first bead of sealant) to the outer surface 24B of first pane of transparent material 14 and a second side surface adhered (by a second bead of sealant) to third pane of transparent material 52. A top surface of the tubular spacer can exposed to between-pane space 54 and, in some examples, includes openings that allow gas within the between-pane space to communicate with desiccating material inside of the spacer. Such a spacer can be fabricated from aluminum, stainless steel, a thermoplastic, or any other suitable material.

Another example of a spacer that can be used as spacer 56 is a spacer formed from a corrugated metal reinforcing sheet surrounded by a sealant composition. The corrugated metal reinforcing sheet may be a rigid structural component that holds first pane of transparent material 14 apart from third pane of transparent material 52. In yet another example, spacer 56 may be formed from a foam material surrounded on all sides except a side facing a between-pane space with a metal foil. As another example, spacer 56 may be a thermoplastic spacer (TPS) spacer formed by positioning a primary sealant (e.g., adhesive) between first pane of transparent material 14 and third pane of transparent material 52 followed, optionally, by a secondary sealant applied around the perimeter defined between the substrates and the primary sealant. Spacer 56 can have other configurations, as will be appreciated by those of ordinary skill in the art.

Depending on application, first patent of transparent material 14, second pane of transparent material 16, and/or third pane of transparent material 52 (when included) may be coated with one or more functional coatings to modify the performance of privacy structure. Example functional coatings include, but are not limited to, low-emissivity coatings, solar control coatings, and photocatalytic coatings. In general, a low-emissivity coating is a coating that is designed to allow near infrared and visible light to pass through a pane while substantially preventing medium infrared and far infrared radiation from passing through the panes. A low-emissivity coating may include one or more layers of infrared-reflection film interposed between two or more layers of transparent dielectric film. The infrared-reflection film may include a conductive metal like silver, gold, or copper. A photocatalytic coating, by contrast, may be a coating that includes a photocatalyst, such as titanium dioxide. In use, the photocatalyst may exhibit photoactivity that can help self-clean, or provide less maintenance for, the panes.

The electrode layers 20, 22 of privacy glazing structure 12, whether implemented alone or in the form of multiple-pane structure with a between-pane space, can be electrically connected to a driver. The driver can provide power and/or control signals to control optically active material 18. In some configurations, wiring is used establish electrical connection between the driver and each respective electrode layer. A first wire can provide electrical communication between the driver and the first electrode layer 20 and a second wire can provide electrical communication between a driver and the second electrode layer 22. In general, the term wiring refers to any flexible electrical conductor, such as a thread of metal optionally covered with an insulative coating, a flexible printed circuit, a bus bar, or other electrical connector facilitating electrical connection to the electrode layers.

Figure 3:
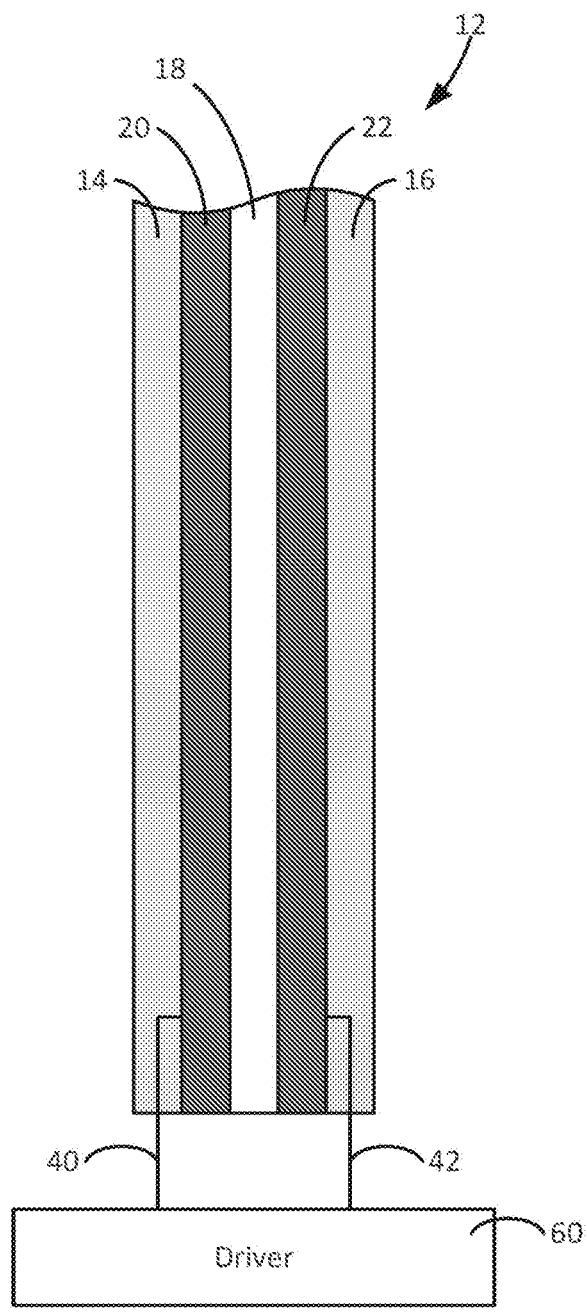
FIG. 3 is an exemplary schematic illustration showing an example connection arrangement of a driver to electrode layers of a privacy structure.

FIG. 3 is a schematic illustration showing an example connection arrangement between a driver and electrode layers of a privacy structure. In the illustrated example, wires 40 and 42 electrically couple driver 60 to the first electrode layer 20 and the second electrode layer 22, respectively. In some examples, wire 40 and/or wire 42 may connect to their respective electrode layers via a conduit or hole in the transparent pane adjacent the electrode layer. In other configurations, wire 40 and/or wire 42 may contact their respective electrode layers at the edge of the privacy structure 12 without requiring wire 40 and/or wire 42 to extend through other sections (e.g., transparent panes 14, 16) to reach the respective electrode layer(s). In either case, driver 60 may be electrically coupled to each of electrode layers 20 and 22.

In operation, the driver 60 can apply a voltage difference between electrode layers 20 and 22, resulting in an electric field across optically active material 18. The optical properties of the optically active material 18 can be adjusted by applying a voltage across the layer. In some embodiments, the effect of the voltage on the optically active material 18 is independent on the polarity of the applied voltage. For example, in some examples in which optically active material 18 comprises liquid crystals that align with an electric field between electrode layers 20 and 22, the optical result of the crystal alignment is independent of the polarity of the electric field. For instance, liquid crystals may align with an electric field in a first polarity, and may rotate approximately 180° in the event the polarity if reversed. However, the optical state of the liquid crystals (e.g., the opacity) in either orientation may be approximately the same.

In some embodiments, optical active material 18 behaves electrically similar to a dielectric between the first electrode layer 20 and the second electrode layer 22. Accordingly, in some embodiments, the first electrode layer 20, the optically active material 18, and the second electrode layer 22 together behave similar to a capacitor driven by driver 60. In various examples, the privacy glazing structure 12 can exhibit additional or alternative electrical properties, such as resistance and inductance, for example, due to the structure itself and/or other features, such as due to the contact between the driver and the electrode layers 20, 22 (e.g., contact resistance). Thus, in various embodiments, the privacy glazing structure 12 electrically coupled to driver 60 may behave similarly to a capacitor, an RC circuit, and RLC circuit, or the like.

Figure 4A:
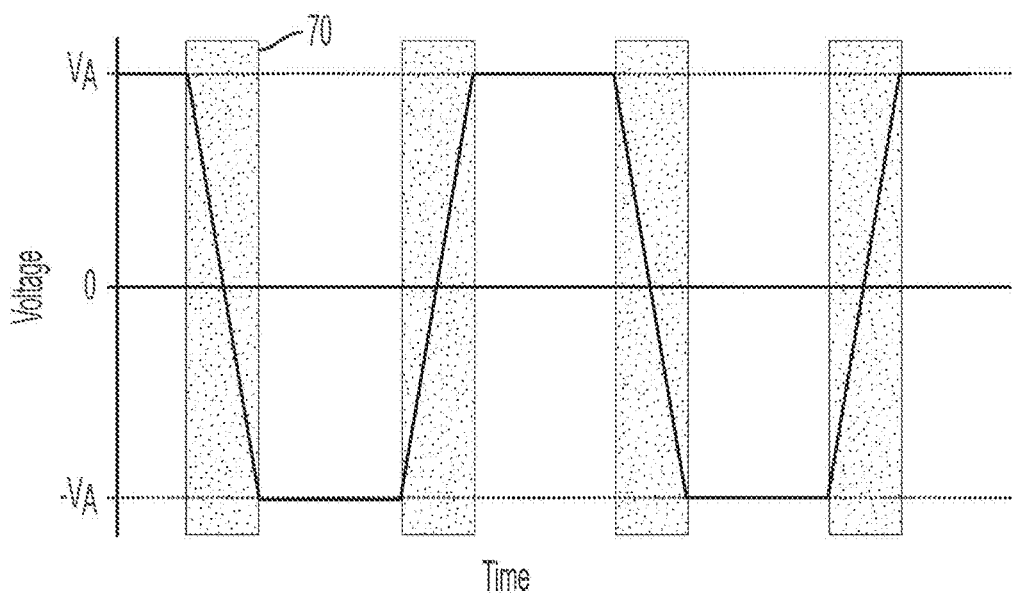
FIGS. 4A and 4B show exemplary driver signals applied between a first electrode layer and a second electrode layer over time.

FIG. 4A shows an example alternating current drive signal that may be applied between first electrode layer 20 and second electrode layer 22 over time. It will be appreciated that the signal of FIG. 4A is exemplary and is used for illustrative purposes, and that any variety of signals applied from the driver may be used. In the example of FIG. 4A, a voltage signal between the first electrode layer and the second electrode layer produced by the driver varies over time between applied voltages $V_A$ and $-V_A$. In other words, in the illustrated example, a voltage of magnitude $V_A$ is applied between the first and second electrode layers, and the polarity of the applied voltage switches back and forth over time. The optical state (e.g., either transparent or opaque) of optically active layer 18 may be substantially unchanging while the voltage is applied to the optically active layer even though the voltage applied to the layer is varying over time. The optical state may be substantially unchanging in that the unaided human eye may not detect changes to optically active layer 18 in response to the alternating polarity of the current. However, optically active layer 18 may change state (e.g., from transparent to opaque) if the driver stops delivering power to the optically active layer.

As shown in the example of FIG. 4A, the voltage does not immediately reverse polarity from $V_A$ to $-V_A$. Instead, the voltage changes polarity over a transition time 70 (shaded). In some examples, a sufficiently long transition time may result in an observable transition of the optically active material from between polarities. For instance, in an exemplary embodiment, liquid crystals in an optically active material may align with an electric field to create a substantially transparent structure, and become substantially opaque when the electric field is removed. Thus, when transitioning from $V_A$ (transparent) to $-V_A$ (transparent), a slow enough transition between $V_A$ and $-V_A$ may result in an observable optical state (e.g., opaque or partially opaque) when $-V_A < V < V_A$ (e.g., when $|V| << V_A$). On the other hand a fast enough transition between polarities (e.g., from $V_A$ to $-V_A$) may appear to an observer (e.g., to the naked eye in real time) to result in no apparent change in the optical state of the optically active material.

Figure 4B:
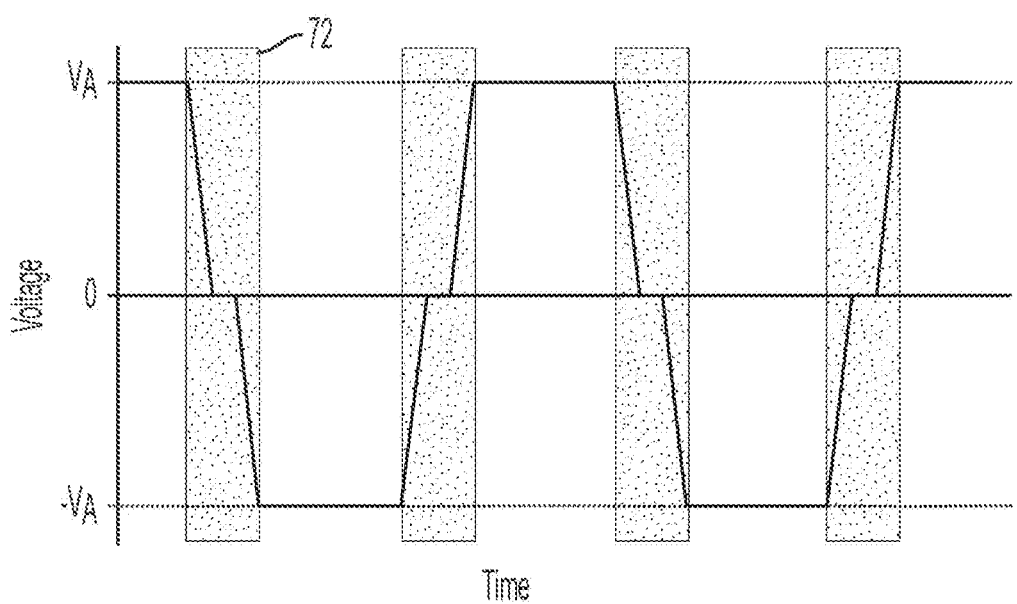

FIG. 4B shows another example alternating current drive signal that may be applied between first electrode layer 20 and second electrode layer 22 over time. The drive signal of FIG. 4B includes a substantially tri-state square wave, having states at $V_A$, 0, and $-V_A$. As shown, during transition time 72 between $V_A$ and $-V_A$, the signal has a temporarily held state at 0V. While shown as being much shorter than the duration of the drive signal at $V_A$ and $-V_A$, in various embodiments, the amount of time the signal is held at 0V (or another third state value) can be less than, equal to, or greater than the amount of time that the drive signal is held at $V_A$ or $-V_A$. In some examples, the amount of time that the drive signal is held at 0V (or another intermediate state) is short enough so that the optically active material does not appear to change optical states.

In some examples, if a particular optical state (e.g., a transparent state) is to be maintained, switching between polarities that each correspond to that optical state (e.g., between $+V_A$ and $-V_A$) can prevent damage to the optically active material. For example, in some cases, a static or direct current voltage applied to an optically active material can result in ion plating within the structure, causing optical defects in the structure. To avoid this optical deterioration, a driver for an optically active material (e.g., in an electrically dynamic window such as a privacy structure) can be configured to continuously switch between applied polarities of an applied voltage (e.g. $V_A$) in order to maintain the desired optical state.

One technique for applying a voltage of opposite polarities to a load (e.g., an optically active material) is via a switching network, such as an H-bridge configuration, such as described in U.S. Provisional Patent Application No. 62/669,005, entitled ELECTRICALLY CONTROLLABLE PRIVACY GLAZING STRUCTURE WITH ENERGY RECAPTURING DRIVER, filed May 9, 2018, which is assigned to the assignee of the instant application and is incorporated by reference in its entirety.

Figure 5:
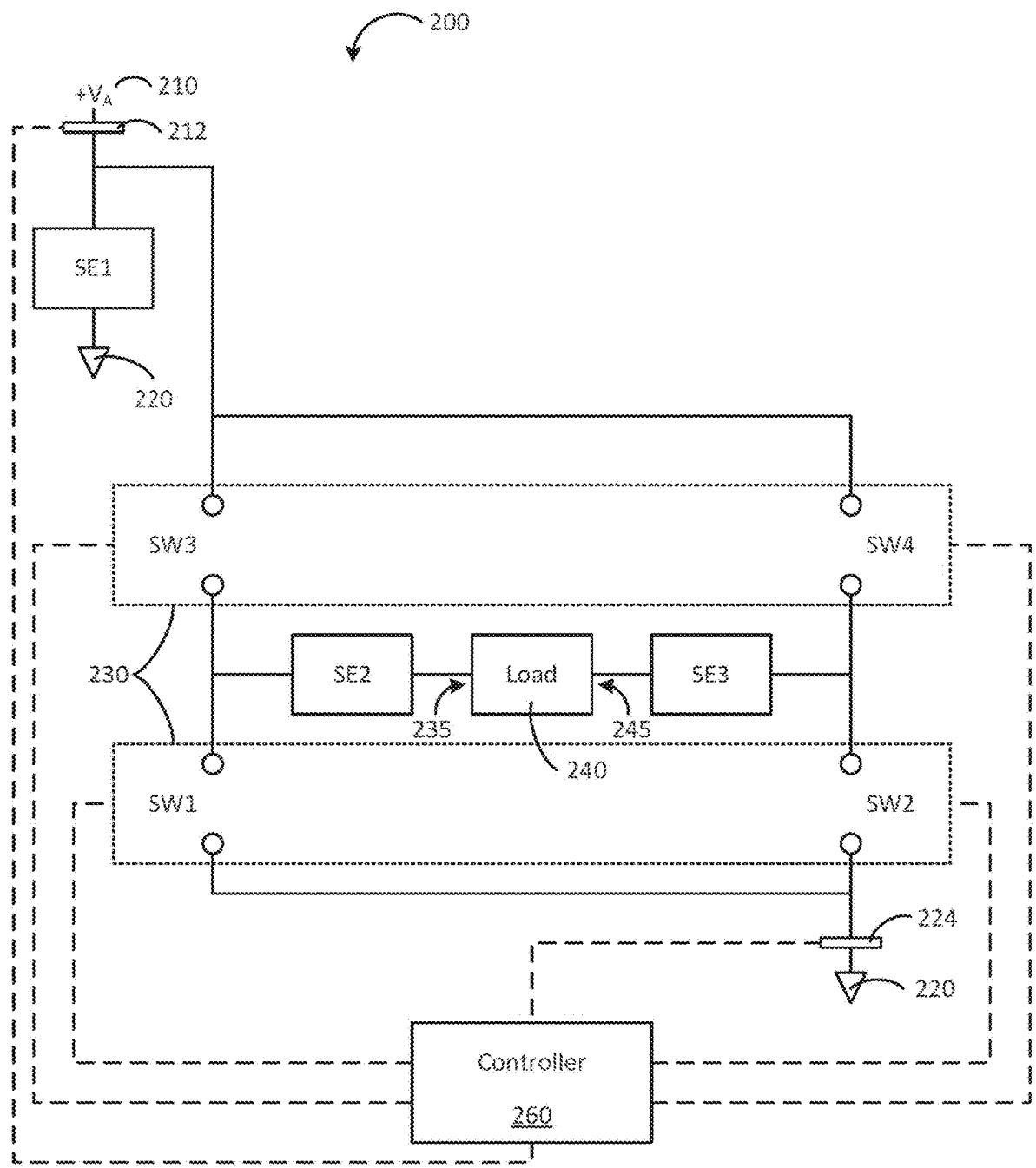
FIG. 5 shows an exemplary driver configuration including a switching network and a plurality of energy storage devices in communication therewith.

FIG. 5 shows an example driver configuration including a switching network and a plurality of energy storage devices in communication with the switching network. In the illustrated example, driver 200 includes a power source 210 shown as applying a voltage $V_A$, a ground 220, and a switching network 230 used to drive load 240, for example, in opposing polarities. Switching network 230 can include one or more switching mechanisms capable of selectively electrically connecting and disconnecting components on either side of the switching mechanism. In various embodiments, switching mechanisms can include transistors, such as metal-oxide-semiconductor field-effect transistors (MOSFETs) or the like. Power source 210 may be a direct current power source (e.g., battery), an alternating current power source (e.g., wall or mains power) or other suitable power source. The drive load 240 may be electrically controllable optically active material 18 along with first and second electrode layers 20, 22.

In the example of FIG. 5, switching network 230 includes a first switching mechanism SW1 coupled between a first side 235 of a load 240 and ground 220 and a second switching mechanism SW2 coupled between a second side 245 of the load 240 and ground 220. In some examples, an isolating component 224 can selectively prevent or permit current flow from switching mechanisms SW1, SW2 to ground 220. Switching network 230 further includes a third switching mechanism SW3 coupled between the first side 235 of the load 240 and the power source 210 and a fourth switching mechanism SW4 coupled between the second side 245 of the load 240 and the power source 210. It will be appreciated that, as used herein, being "coupled to" or "coupled between" components implies at least indirect electrical connection. However, unless otherwise stated, the terms "coupled to" or "coupled between" does not require that the "coupled" components be directly connected to one another.

The driver 200 of FIG. 5 includes first energy storage element SE1, which is shown as being in electrical communication with the third and fourth switching mechanisms, SW3 and SW4, respectively and power source 210 on a first side, and ground 220 on another side. Isolating component 212 is shown as being positioned to selectively enable or disable current flow between the power source 210 and other components of the driver 200, such as the first energy storage element SE1 or the third and fourth switching mechanisms.

The driver 200 further includes a second energy storage element SE2 coupled to the first side 235 of the load 240 and being coupled between the third switching mechanism SW3 and the first switching mechanism SW1. Similarly, the driver includes a third energy storage element SE3 coupled to the second side 245 of the load 240 and being coupled between the fourth switching mechanism SW4 and the second switching mechanism SW2.

In various embodiments, energy storage elements can be electrical energy storage elements, such as inductive storage elements, capacitive storage elements, one or more batteries, or the like. In some examples, storage elements SE1, SE2, and SE3 are the same. In other examples, at least one of SE1, SE2, and SE3 is different from the others. In some embodiments, SE1 comprises a capacitive energy storage element and SE2 and SE3 comprise inductive energy storage elements. In some such embodiments, SE2 and SE3 comprise matched inductive energy storage elements.

The driver 200 in FIG. 5 further includes a controller 260 in communication with the switching network 230. In the illustrated example, controller 260 is in communication with each of the switching mechanisms (SW1, SW2, SW3, SW4). Controller 260 can be configured to control switching operation of the switching mechanisms, for example, by opening and closing switching mechanisms to selectively electrically connect or disconnect components on either side of each of the switching mechanisms. In various embodiments, controller 260 can be configured to control switching mechanisms in series and/or in parallel (e.g., simultaneous switching).

In some examples, the controller 260 is configured to control the switching mechanisms in order to provide a voltage (e.g., from power source 210) to load 240, such as an optically active material in an electrically dynamic window. Further, in some embodiments, the controller 260 can be configured to control the switching mechanisms in order to periodically change the polarity of the voltage applied to the load 240. In some such examples, operation of the switching network can be performed so that at least some of the energy discharged from the load (e.g., when changing polarities) can be recovered and stored in one or more energy storage elements SE1, SE2, SE3. Such recovered and stored energy can be used, for example, to perform subsequent charging operations.

As described, in some embodiments, driver 200 further includes additional components for selectively preventing current flow to various portions of the driver. For instance, in the illustrated embodiment of FIG. 5, driver 200 includes isolating component 212 configured to selectively permit current flow between power source 210 and other portions of the driver. Similarly, driver 200 includes isolating component 224 configured to selectively permit current flow between ground 220 and other portions of the driver 200. In some examples, isolating components 212, 224 can be controlled via the controller 260 during various phases of driver operation. Isolating components can include any of a variety of suitable components for selectively permitting and/or preventing current flow between various driver components. For example, in various embodiments, isolating components 212, 224 can include switches, transistors (e.g., power MOSFETs), or other components or combinations thereof.

Other possible driver configurations are possible, for example, omitting one or more of the above-referenced features, such as one or more energy storage elements, switches, or the like. For instance, in various examples, a driver can be configured output an AC electrical drive signal without requiring switching elements.

Figure 6:
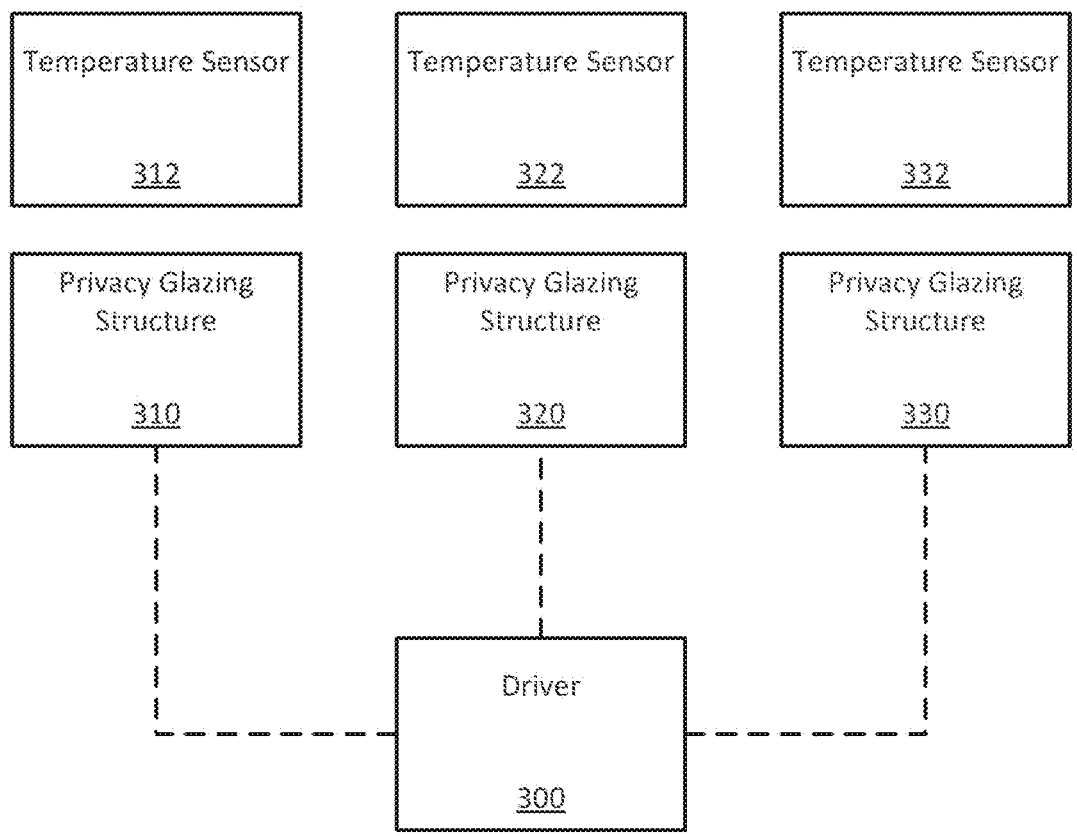
FIG. 6 shows a driver in communication with a plurality of privacy glazing structures.

FIG. 6 shows a driver 300 in communication with a plurality of privacy glazing structures 310, 320, 330. In various embodiments, the driver 300 can be configured to communicate with privacy glazing structures 310, 320, 330 simultaneously, for example, to control operation of a plurality of structures at the same time. Additionally or alternatively, privacy glazing structures 310, 320, 330 can be interchangeably placed in communication with driver 300. For instance, in an exemplary embodiment, driver 300 can include an electrical interface to which any of a plurality of privacy glazing structures (e.g., 310, 320, 330) can be coupled. In some embodiments, the driver 300 can be configured to provide electrical drive signals to each of the plurality of privacy glazing structures 310, 320, 330 for optically controlling such structures.

In some examples, electrical drive signals provided from the driver 300 to each privacy glazing structure are limited for safety reasons, for example, to comply with one or more safety standards. For instance, in some embodiments, electrical drive signals are power limited to satisfy one or more electrical safety standards, such as NEC Class 2. Providing drive signals that satisfy one or more such safety standards can enable safe installation by a wide range of people, for example, by enabling installation without requiring licensed electricians.

In the illustrated example, each of the privacy glazing structures 310, 320, 330 has one or more corresponding temperature sensors, 312, 322, and 332, respectively, that can provide temperature information regarding the corresponding privacy glazing structure. Temperature information can include, for example, contact temperature information (e.g., surface temperature) or non-contact temperature information (e.g., air temperature). In some examples, such temperature sensors 312, 322, 332 can provide such temperature information to driver 300.

However, in some cases, different privacy glazing structures have different electrical properties, for example, due to different sizes, different materials, and the like. As a result, different structures may require different drive signals to operate effectively and/or efficiently. For instance, in some embodiments, a drive signal that works well for a given privacy glazing structure may result in poor optical performance in a different privacy glazing structure due to differences between the structures.

In some examples, a driver can receive identification information from a privacy glazing structure, for example, from a memory storage component on the structure including identification information readable by the driver. In some such examples, the driver can be configured to read such identification information and establish an electrical drive signal (e.g., from a lookup table stored in a memory) for driving the identified structure. However, while providing a first order estimate on an appropriate drive signal for a given structure, in some cases, variations between similar structures (e.g., due to manufacturing variability, environmental factors, aging characteristics, for example, due to UV degradation, etc.) can result in different electrical characteristics between such similar structures. Thus, even two privacy glazing structures of the same make/model may have different characteristics that can lead to inconsistencies between such structures when driven with the same electrical drive signal.

In some embodiments, a driver can be configured to characterize one or more properties of a privacy glazing structure in communication therewith in order to determine one or more drive signal parameters suitable for driving the privacy glazing structure. For example, in some embodiments, a driver is configured to apply an electrical sensing pulse to a privacy glazing structure and analyze the response of the privacy glazing structure to the electrical sensing pulse. The driver can be configured to characterize the privacy glazing structure based on the analyzed response to the electrical sensing pulse. In some embodiments, the driver can be configured to characterize one or more parameters of the privacy glazing structure based on the analyzed response, such as one or more electrical parameters.

Figure 7:
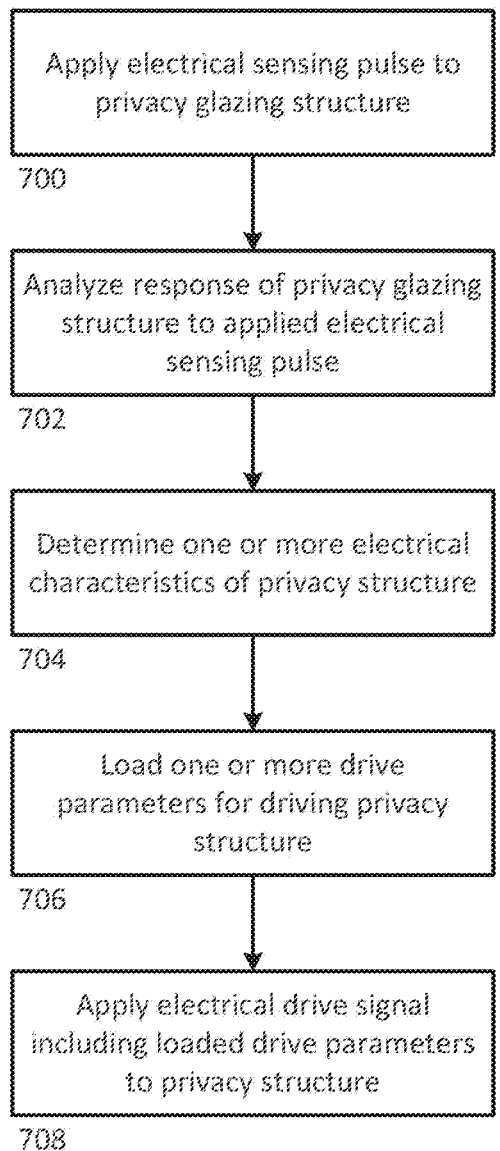
FIG. 7 shows an exemplary process-flow diagram illustrating an exemplary process for driving a privacy glazing structure with an electrical drive signal based on privacy structure characterization.

FIG. 7 shows an exemplary process-flow diagram illustrating an exemplary process for driving a privacy glazing structure with an electrical drive signal based on privacy structure characterization. The process includes applying an electrical sensing pulse to the privacy glazing structure (700).

The method of FIG. 7 further comprises analyzing a response of the privacy glazing structure to the applied electrical sensing pulse (702). In some examples, the electrical sensing pulse comprises a voltage pulse (e.g., having a known voltage vs. time), and the analyzed response comprises measuring a current flowing through the privacy glazing structure over the time the voltage pulse is applied. Additionally or alternatively, the analyzed response can include a measurement of a voltage or current value at a specific time relative to the application of the sensing pulse (e.g., 40 milliseconds after the sensing pulse) or a specific time range (e.g., between 5 and 40 milliseconds after the sensing pulse). In some examples, the time or time period can be determined based on measured or estimated electrical parameters, such as a resistance and capacitance value, so that time or time period captures data within or over a certain time period relative to the parameters, such as 10 RC time constants. The method further includes determining one or more electrical characteristics of the privacy structure (704). Such one or more electrical characteristics can include a resistance, a capacitance, an inductance, or any combination thereof. For instance, in some examples, a resistance value corresponds to contact/lead resistance associated with applying electrical signals to the electrode layer(s) (e.g., 20, 22). Additionally or alternatively, a capacitance value can correspond to the capacitance of the optically active material 18 between the electrode layers 20 and 22. After determining the one or more electrical characteristics, the driver can be configured to load one or more drive parameters for driving the privacy glazing structure (706). Drive parameters can include one or more electrical drive signal parameters, such as a voltage (e.g., peak voltage), frequency, slew rate, wave shape, duty cycle, or the like.

In some examples, characterizing one or more electrical parameters comprises determining a resistance value (e.g., an equivalent series resistance), a capacitance value, and/or an inductance value associated with the privacy glazing structure. In some such examples, the driver can be configured to generate a representative circuit including the one or more electrical parameters, such as an RC circuit or an RLC circuit. In some embodiments, loading one or more drive parameters (706) can be performed based on such determined one or more electrical parameters, for example, based on one or more lookup tables and/or equations.

In some embodiments, loading one or more drive parameters (706) comprises establishing a drive signal. Additionally or alternatively, if a drive signal is currently in place, loading one or more drive parameters can include adjusting one or more drive parameters of the existing drive signal. In various examples, adjusting one or more parameters can include loading a new value for the one or more parameters, or can include a relative adjustment, such as increasing or decreasing a value associated with the one or more parameters with respect to an existing electrical drive signal.

Once the one or more parameters associated with the determined one or more electrical characteristics are loaded, the driver can be configured to apply an electrical drive signal that includes the loaded drive parameter(s) to the privacy structure (708).

In some examples, the process of FIG. 7 can be performed at a plurality of times. In some such examples, the analyzed response to the applied electrical sensing pulse (e.g., step 702) can include calculating a time-based value of a response, such as a temporal derivative or running average of a measured response (e.g., resulting voltage or current value). Additionally or alternatively, such response data can be filtered over time, for example, to remove noise, outliers, etc. from the data collected over time. Such a time-based value can be used to determine one or more electrical characteristics of the privacy structure.

In some embodiments, the process shown in FIG. 7 is performed upon a start-up process of a privacy glazing structure, such as during an initial installation. An installer may connect the driver to a privacy glazing structure, and the driver may perform the method shown in FIG. 7 in order to establish and apply an initial drive signal for the privacy glazing structure. Such a process can be initiated manually and/or automatically. In some examples, the ability of the driver to determine and apply an appropriate electrical drive signal for a privacy glazing structure eliminates the need for different drivers to drive different types of privacy glazing structures, and enables loading an appropriate drive signal without requiring expertise of which drive parameters may be suitable for a given privacy glazing structure.

FIG. 8 shows an exemplary categorization of electrical characterizations of different privacy glazing structures and corresponding electrical drive signal parameters. As shown in the exemplary illustration of FIG. 8, a structure can be categorized according to a low or high resistance value and a low or high capacitance value. In some examples, a driver can be programmed with threshold values to designate which resistance values are "low" and which are "high," and similarly, which capacitance values are "low" and which are "high."

One category of privacy glazing structure shown in FIG. 8 includes a low resistance and a low capacitance. Such structures can include, for example, small structures (e.g., contributing to a low capacitance value) having busbar contacts (e.g., contributing to a low resistance value). In some cases, low resistance values can lead to large current spikes when a square wave or other sharp transitioning voltage signal is applied to the structure. Accordingly, a corresponding electrical drive signal can include one or more features to mitigate risks of a large current value, such as employing a maximum current regulator, utilizing a slew-rate square wave, and/or a pulse-width modulated (PWM) signal (e.g., from the rail voltage). In some examples, a lower-frequency electrical drive signal can be used to minimize average power consumption over time. One or more such features can adequately charge a small capacitive load (e.g., a capacitive electrically controllable optically active material in a privacy glazing structure) to provide proper aesthetic structure behavior while reducing large current spikes.

Another category of structure in the example of FIG. 8 comprises a low resistance and high capacitance structure, for example, a large structure (having a high capacitance value) and busbar contacts (contributing to a low resistance value). Such a structure may also be susceptible to large current spikes due to the low resistance, though the low resistance can facilitate filling the capacitance with charge quickly to provide high quality aesthetics during operation of the structure. Similar techniques can be employed to reduce the risk of current spikes, such as a maximum current regulator, a slew-rate square wave signal, or applying a PWM signal.

Another category of structure according to the example of FIG. 8 includes a high resistance and a high capacitance, for example, a large structure having point contacts (e.g., contributing to a higher resistance value). In some such instances, a large resistance value may limit current spikes, but also may make it more difficult to fill the capacitance with charge. Further, since the capacitance is large, it can require a large amount of charge to quickly charge the structure for good aesthetic behavior. Thus, in some examples, an electrical drive signal can include an overdriven square wave. For instance, in some embodiments, the electrical drive signal comprises a square wave in which a portion of the square wave is overdriven. In an exemplary implementation, within a square wave pulse, the first half of the pulse may be applied at a higher voltage than the second half of the pulse in order to more quickly fill the capacitance of the structure. Additionally or alternatively, a lower frequency waveform can be used in order to provide additional time for the large capacitance to be charged.

A fourth category of structure according to the example of FIG. 8 includes a high resistance and a low capacitance, for example, a small structure having point contacts. The high resistance generally will reduce large current spikes, and the small capacitance generally allows for a relatively small amount of current necessary to fill the capacitance with charge to achieve good optical aesthetics. In some examples, such a structure can operate with a "default" electrical drive signal. In some embodiments, various electrical parameters can be adjusted and/or implemented to increase operation efficiency, such as incorporating a voltage slew-rate to mitigate excessive current peaks and minimize peak power consumption and/or reducing frequency to mitigate average power consumption.

While shown as two bins for two categories, it will be appreciated that any number of parameters may be analyzed, and may be distinguishable by any number of bins. For instance, in general, a group of N parameters (in FIG. 8, N=2; resistance and capacitance) can be divided into M bins (in FIG. 8, M=2; low and high) into which the parameter values may fall. Combinations of the characteristics and corresponding bins into which they fall can be used to identify (e.g., via equation or lookup table) an appropriate electrical drive signal for driving the privacy glazing structure having such characteristics.

In some examples, methods similar to that shown in FIG. 7 can be repeated over time. Such methods can be carried out manually or automatically (e.g., according to a pre-programmed schedule) in order to determine if a drive signal should be updated based on changes in one or more electrical characteristics of the privacy glazing structure. In some such examples, the existing drive signal may be stopped in order to execute a method similar to that shown in FIG. 7 to determine whether or not a drive signal should be updated. This can be performed manually or according to a schedule, for example, at night, when undesirable optical characteristics that may result from an interruption in operation may go unnoticed. In some such embodiments, various data can be stored in memory, such as determined characteristics of the privacy glazing structure based on the response to the applied sensing pulse. In some examples, characteristics of the privacy glazing structure determined at installation to establish an electrical drive signal are associated with an initial time $t_0$.

Figure 9:
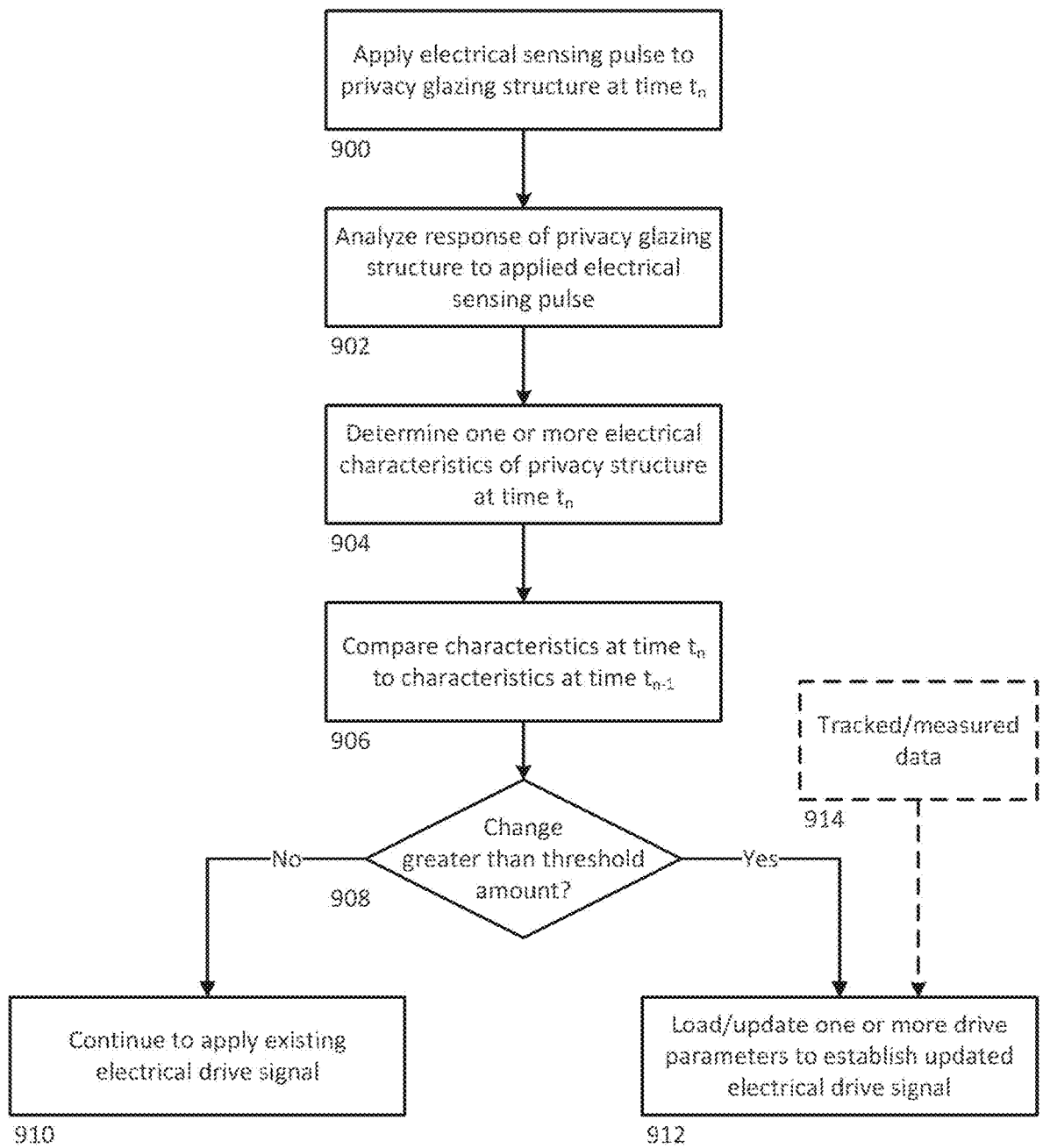
FIG. 9 shows a process-flow diagram for updating an electrical drive signal provided to a privacy glazing structure via an electrical driver.

FIG. 9 shows a process-flow diagram for updating an electrical drive signal provided to a privacy glazing structure via an electrical driver. In an exemplary implementation, the method shown in FIG. 9 can be performed after a driver has been applying an existing drive signal to a privacy glazing structure. The method of FIG. 9 includes applying an electrical sensing pulse to a privacy glazing structure at a time $t_n$ (900), analyzing the response of the privacy glazing structure to the applied electrical sensing pulse (902), and determining one or more electrical characteristics of the privacy glazing structure at time $t_n$ (904). The method includes comparing the determined characteristics at time $t_n$ to characteristics determined at a previous time $t_{n-1}$ (906). If the change in the characteristic(s) at time $t_n$ with respect to the characteristic(s) at time $t_{n-1}$ is not greater than a threshold amount (908), then the driver continues to apply the existing electrical drive signal (910). If the change in the characteristic(s) between times $t_{n-1}$ and $t_n$ is/are greater than a threshold amount (908), the driver can be configured to load and/or update one or more drive parameters to establish an updated electrical drive signal (912).

In some embodiments, the updated electrical drive signal can be determined based on the determined electrical characteristics at time $t_n$, similar to loading one or more drive parameters based on the determined characteristics as described with respect to FIG. 7. Additionally or alternatively, loading/updating one or more drive parameters to establish the updated electrical drive signal can comprise adjusting one or more drive parameters based on an amount of change detected for the one or more electrical characteristics.

With respect to FIG. 9, determining whether or not the change(s) in one or more electrical characteristics between times $t_{n-1}$ and $t_n$ is/are greater than a threshold amount can be performed in a variety of ways. In some embodiments, each characteristic(s) includes a corresponding absolute threshold difference that, if surpassed, causes a change in the one or more parameters of the electrical drive signal. For instance, in an exemplary embodiment, if a resistance value measured as one of the one or more electrical characteristics changes by more than 1000 Ohms, the change is considered to be greater than the threshold. Additionally or alternatively, a change greater than a threshold amount can correspond to a percentage change in a characteristic. For example, in some embodiments, one or more drive parameters can be updated in response to a resistance value increasing by at least 100%. In another example, one or more drive parameters can be updated in response to a capacitance value changing by at least 10%.

In some embodiments, change in each of the one or more parameters over time can be compared to a corresponding threshold. In some examples, if any one characteristic differs from its previous value by a corresponding threshold amount, the change in characteristic(s) is considered to be greater than the threshold amount, and an updated electrical drive signal is established. In other examples, the amount of change in each of the one or more characteristics must be greater than a corresponding threshold amount in order for the change to be considered greater than a threshold and to update an electrical drive signal. In various embodiments, different combinations of electrical characteristics (e.g., a subset of a plurality of determined characteristics) can be analyzed to determine whether or not the change in the characteristics is greater than a threshold amount.

In some embodiments, loading/updating one or more drive parameters (912) can be based on additional tracked/measured data 914. Tracked/measured data 914 can include information such as the age of the privacy glazing structure, the temperature of the privacy glazing structure, or the like. In some examples, the driver can be configured to adjust one or more drive parameters based on such data.

For instance, in an exemplary embodiment, in the event that the change(s) in one or more electrical characteristics between times $t_{n-1}$ and $t_n$ is/are greater than a threshold amount, the driver can be configured to acquire temperature information (e.g., structure and/or environment temperature information) and update the one or more drive parameters based on the temperature information. Temperature information can be received, for example, from a contact (e.g., thermocouple) or non-contact (e.g., infrared) temperature measurement device that outputs temperature information representative of the structure itself. Additionally or alternatively, temperature information can be received from an ambient temperature sensor. In some examples, one or more temperature sensors can be associated with each of one or more privacy glazing structures in a privacy system. For example with respect to FIG. 6, temperature sensors 312, 322, 332 can be configured to provide temperature information (e.g., contact and/or environmental temperature information) associated with corresponding privacy glazing structures 310, 320, 330, respectively.

In addition or alternatively to temperature information, if the change(s) in one or more electrical characteristics between times $t_{n-1}$ and $t_n$ is/are greater than a threshold amount, the driver can be configured to determine the age of the privacy glazing structure and update one or more drive parameters based upon the age of the structure. In some examples, a driver can be configured to flag a structure as aging, for example, when the structure has been in operation for a predetermined amount of time and/or when the electrical characteristics are representative of an aging structure. Age and/or temperature can be used in addition or alternatively to the determined electrical characteristics when determining an updated electrical drive signal.

As described with respect to FIGS. 7 and 9, in various processes, the driver can be configured to apply an electrical sensing pulse to a privacy glazing structure for characterizing the structure (e.g., determining one or more electrical characteristics thereof). In some examples, the characterizing the structure comprises determining one or more electrical parameters of the structure, such as a resistance, a capacitance, etc., and in some such examples, comprises determining an equivalent circuit representative of the structure's electrical properties (e.g., an RC circuit, an RLC circuit, etc.).

In various embodiments, different electrical sensing pulses can be used to determine such characteristics. For instance, in various examples, an electrical sensing pulse can include a DC sense pulse, a low frequency drive signal (e.g., a signal having similar characteristics, such as amplitude or waveform, of a drive signal but having lower frequency), or an operational drive signal (e.g., a currently-implemented drive signal). In some embodiments, a user may select which type of electrical sensing pulse to use when characterizing a privacy glazing structure.

In some cases, a DC sense pulse can provide the most accurate characterization, since the DC signal can be applied over several RC time constants of the structure. In some embodiments, the DC pulse is applied to a structure for at least five time constants, but can also be applied for longer amounts of time, such as for at least 10 time constants, at least 100 time constants, at least 1000 time constants, or other values. While the exact value of an RC time constant may not be known a priori, in some examples, a privacy glazing structure can have an expected range of time constants (e.g., associated with different structure sizes, types, etc.) that can be used to determine, for example, a minimum DC pulse length to increase the likelihood that the DC sense pulse lasts at least a minimum number of time constants. A potential drawback to a DC sense pulse is that during the pulse, the visual aesthetics of the privacy glazing structure may degrade. However, this type of electrical sensing pulse can be used during, for example, an installation procedure or when the structure is not in use, a temporary decline in the aesthetic appearance of the structure may be acceptable.

In some examples, an operational drive signal can be used as an electrical sensing pulse, such as one of the drive signals shown in FIGS. 4A and 4B. In an exemplary embodiment, such a drive signal can be applied at a frequency of between approximately 45 and 60 Hz. In some such examples, such a frequency generally results in pulses that are too short to reach several RC time constants for structure characterization, and as a result, may provide a less accurate characterization when compared to a longer DC sense pulse. However, since the operational drive signal doubles as the electrical sensing pulse, no aesthetic degradation occurs during the characterization process. Thus, characterization using the operational drive signal as an electrical sensing pulse can be performed during the daytime when the chances of being viewed are high.

In some cases, a low frequency drive signal can provide a balance between the DC sense pulse and the operation drive signal as a sense pulse. For example, in some embodiments, reducing the frequency of the drive signal provides added time for characterizing the response of the privacy glazing structure to the signal while not impacting the aesthetics of the privacy glazing structure as severely as a longer DC sense pulse. In some examples, a low frequency drive signal has a frequency range between approximately 5 and 45 Hz. In some cases, the low frequency drive signal still reduces the aesthetics of the privacy glazing structure, and so may be suitable for applying at night when it is unlikely that the privacy glazing structure will be viewed with temporarily reduced aesthetics.

In various embodiments, a user may manually initiate a privacy glazing structure characterization process in which one or more electrical sensing pulses is applied to the privacy glazing structure determining one or more electrical characteristics of the structure, for example, to determine or update an electrical drive signal. In some such examples, a user may select from a plurality of available electrical sensing pulse types, such as those described elsewhere herein. Additionally or alternatively, in some examples, a driver can be configured to automatically perform a characterization process, for example, according to a predetermined schedule (e.g., once per hour, once per day, once per week, etc.). In some such examples, a driver can be configured to perform different characterization processes according to when the process is carried out. For instance, upon initial installation, a driver can apply a DC sense pulse to initially characterize the structure and establish an electrical drive signal.

After installation, the driver can be configured to periodically apply an electrical sensing pulse to characterize the structure, for example, to determine if one or more characteristics of the structure have changed and/or if an electrical drive signal should be updated, such as described with respect to FIG. 9. In some such examples, the driver can be configured to select an electrical sensing pulse to apply, for instance, depending on a time of day or other factors. For example, in some embodiments, the driver can be configured to apply a low frequency drive signal electrical sensing pulse, such as described elsewhere herein, if the electrical sensing pulse is applied during one or more predetermined intervals, such as when temporary aesthetic degradation may not be noticed. Outside of the predetermined time intervals, for example, when temporary aesthetic degradation may be noticed, the driver can be configured to apply an electrical sensing pulse that is the operational drive signal to reduce or eliminate the impact on the structure aesthetics during a characterization process.

In some examples, different update schedules may be implemented according to the processing capabilities of the system components used for performing the analysis. For instance, in some embodiments, on-board processing components may have limited processing ability, and may perform such analysis less frequently than a cloud-based processing system with greater processing resources.

In some examples, periodic characterization of a privacy glazing structure over time can be used to track structure operation and aging characteristics or to adjust the electrical drive signal to accommodate for changing characteristics, for example, as described with respect to FIG. 9. In some embodiments, determined one or more electrical characteristics captured at a plurality of times can be saved in memory, for example, for comparison (e.g., as described with respect to FIG. 9), trend analysis, etc. In some examples, the driver can be configured to perform statistical analysis of the electrical characteristics over time and recognize patterns. Patterns can include trending of one or more electrical characteristics in a given direction over time (e.g., due to structure breakdown, etc.), repeating trends (e.g., electrical characteristics changing during daylight and nighttime hours or changing over seasons as ambient temperatures change, etc.). In some cases, the driver can similarly track and/or analyze additional data, such as ambient or structure temperature data, and can be configured to correlate electrical characteristics with such additional data.

Additionally or alternatively, in some implementations, the driver can be configured to periodically characterize aspects of the privacy glazing structure at a different rate throughout the life cycle of the structure. For example, in some cases, the driver characterizes the structure more frequently shortly after installation while the driver learns the behavior and/or typical characteristics of the structure, for example, environmental impacts (e.g., temperature, sunlight, etc.) on structure behavior.

In some examples, the driver can be configured to detect or predict an environmental change (e.g., a temperature change, a change in ambient light, etc.), and can characterize the structure within a short time span (e.g., within minutes or hours) to isolate impacts of certain factors. For example, a driver can be configured to characterize a structure when the sun is blocked by a cloud and then again once the sun is no longer blocked in order to isolate the impact of daylight on the structure characteristics. The driver can be configured to detect such changes, for example, via one or more sensors and/or via data analysis (e.g., via internet access to weather data).

Similarly, in an example implementation, a driver can be configured to detect and/or predict an earthquake (e.g., via internet connectivity to an earthquake notification system and/or one or more accelerometers or other sensors). The driver can be configured to characterize the structure after a detected earthquake to assess for damage or changing operating characteristics. If the driver receives information (e.g., from a notification system) that an earthquake is imminent, the driver can characterize the structure prior to the occurrence of the earthquake and again after the earthquake to specifically detect changes in structure characteristics due to the earthquake.

In some embodiments, the driver can be configured to recognize patterns in electrical characteristics of the privacy glazing structure over time and/or correlate electrical characteristics of the privacy glazing structure with other data, such as ambient or structure temperature data. In some such examples, the driver can be configured to adjust/update one or more drive parameters for an electrical drive signals according to the statistical analysis and recognized patterns and/or correlations. For example, the driver may be configured to automatically switch between summer and winter electrical drive signals based on a recognized change in structure behavior over time. Additionally or alternatively, the driver can be configured to adjust one or more drive parameters based on received data, such as temperature data, based on an observed correlation between temperature data and structure characteristics.

Electrical events, such a detected arcing event within the structure, a power surge, a power outage, a lightning strike, or other events can trigger the driver to perform a characterization in order to detect changes and/or damage to the structure.

In some examples, various electrical drive signal parameters can be adjusted based on tracked and/or measured data, such as aging data and/or temperature data. In some embodiments, such parameters can include voltage (e.g., RMS voltage and/or a peak voltage), frequency, and/or a rise time/slew rate. In various examples, loading/updating one or more drive parameters (e.g., step 912 in FIG. 9) comprises one or more of:

decreasing a voltage value in response to a temperature increase
 increasing a voltage value in response to a temperature decrease
 increasing a voltage value as the structure age increases
 decreasing a frequency value in response to a temperature increase
 increasing a frequency value in response to a temperature decrease
 decreasing a frequency value as the structure age increases
 lengthening a slew rate/rise time in response to a temperature increase
 shortening a slew rate/rise time in response to a temperature decrease
 shortening a slew rate/rise time as the structure age increases.

Alternatively or in addition to factors such as aging and temperature/seasonal changes in the operation of a privacy glazing structure, other factors, such as a structure health metric, can be analyzed. In some embodiments, a health metric includes a measure of a leakage current through the structure. Leakage current can result from a plurality of issues, such as breakdown in a structure material, such as optically active material 18, a poor or breakdown coating, or other volatile portion of a structure. Leakage current can be measured in a variety of ways. In an exemplary embodiment, a leakage current value can be determined based on analysis of a current flowing through the privacy glazing structure during a particular time.

FIGS. and 10A and 10B show exemplary drive signal and resulting response current signal over time for a privacy glazing structure. As shown, a slew-rate square wave voltage applied to the privacy glazing structure results in a periodic current response. While the signals are not necessarily shown on the same scale in FIGS. 10A and 10B, it is apparent that the shape of the current signal through the privacy glazing structure is different between FIG. 10A and FIG. 10B. Such differences can indicate changes in a leakage current flowing through the privacy glazing structure.

FIGS. 11A and 11B show zoomed-in views of the exemplary current and voltage signals of FIGS. 10A and 10B, respectively, including different display scales for ease of display.

In some embodiments, one or more metrics associated with the current signal can be measured during a time when a structure is known to be in good working condition, such as upon installation of the structure. Such metrics can include, for example, a time derivative or integral of the measured current at or over a predetermined portion of the drive signal (e.g., during a positive voltage pulse, etc.). Additionally or alternatively, a difference in an equilibrium current during positive and negative portions of the square wave (shown as $\Delta_1$ and $\Delta_2$ in FIGS. 11A and 11B, respectively) can be used as a metric. For instance, in some embodiments, a measured current response to the applied electrical drive signal comprises measuring a current response during a predetermined portion of the applied drive signal, such as a period of time between transitions in an applied square wave. In some examples, this can avoid comparisons of current responses that include features (e.g., inrush currents) that may be present regardless of the condition of the structure.

One or more current response metrics can be recorded over time in order to determine one or more leakage current values associated with the structure. FIG. 12 shows a process flow diagram showing an exemplary process for determining one or more leakage current values. In some examples, the method in FIG. 12 can be carried about via the driver of a privacy glazing structure. The method includes measuring a value associated with a current response signal for a healthy structure at an initial time $t_0$ (1200). Such measuring can include determining a derivative or integral of the current and/or a difference between equilibrium currents during positive and negative portions of an applied alternating drive signal (e.g., a square wave). In some examples, time $t_0$ generally corresponds to a time when the structure is assumed to be at peak or near-peak health, such as during installation or initial operation.

Next, the method includes again measuring a value associated with the current response signal at a time $t_n$ (1202), which, in a first instance after time $t_0$, may be denoted $t_1$ (n=1). For instance, in some examples, the first measurement after the initial measurement at time $t_0$ is performed at time $t_1$. The method includes determining a leakage current at time $t_n$ based on determined values associated with the current signal at times $t_0$ and $t_n$ (1204). For instance, in some examples, determining the leakage current comprises determining the difference in the measured value at time $t_n$ vs. time $t_0$ in order to determine the change caused by any leakage current that has developed since the measurement of the value for the healthy structure at time $t_0$. In various examples, such determination can be performed locally, for example via the driver, or can be done via cloud-based computing.

The method of FIG. 12 includes determining if the leakage current satisfies a predetermined condition (1206). If the leakage current does not satisfy the predetermined condition, the driver continues to apply an existing electrical drive signal (1208). For instance, in some examples, the leakage current not satisfying the predetermined condition can indicate that there is no leakage current present or the leakage current is small enough so that the existing electrical drive signal can adequately drive the privacy glazing structure without visible optical degradation. In some such cases, the drive signal does not need to be altered to compensate for excess leakage current.

However, in some examples, if the leakage current does satisfy the predetermined condition, the method can include the step of loading and/or updating one or more drive parameters to establish an updated electrical drive signal (1210). For instance, in some examples, excess leakage current can degrade the optical performance of a privacy glazing structure, but can be compensated for via adjustments to the electrical drive signal.

Example adjustments to an electrical drive signal based on excess leakage current can include increasing a voltage (1212), decreasing a frequency (1214), and/or pulsing a voltage (1216). In some examples, increasing a voltage (e.g., the value of $V_A$ in FIG. 4) can compensate for lost voltage due to the leakage current. Decreasing frequency provides additional time for a capacitive optically active material to charge, for example, during a positive portion of a square wave drive signal. In some examples, decreasing a frequency of the electrical drive signal comprises increasing a period of the electrical drive signal. For instance, with respect to the example electrical drive signal shown in FIG. 4A, adjusting an electrical drive signal comprises increasing the amount of time that the voltages $V_A$ and $-V_A$ are applied during each cycle.

With respect to voltage pulsing, in some examples, a drive signal includes one or more floating steps, in which the optically active material is disconnected from power and ground. For instance, with respect to FIG. 5, in some examples, a drive signal can include a period of time during which, for example, all switches SW1, SW2, SW3, and SW4 are opened so that the load (e.g., the optically active material between contact electrodes) maintains its current voltage. However, leakage current may cause the voltage at the load to sag during the floating step. Pulsing the voltage (e.g., step 1216) can include modifying the electrical drive signal to include applying one or more voltage pulses to the load during one or more floating steps in order to maintain a voltage at the load and compensate for voltage sagging due to leakage current. In an example implementation, a drop in voltage from an expected value (e.g., a voltage sag) across the structure can be measured and compared to a predetermined threshold. If the drop in the voltage meets or exceeds the predetermined threshold, a rail voltage pulse can be applied to the load. The frequency of applying the rail voltage pulse can depend on the severity of the sag (e.g., due to the severity of a leakage current). For example, in some cases, the rail voltage pulse can be applied multiple times in a single cycle or half cycle of the applied electrical drive signal.

In various embodiments, the index n can be incremented, and steps in the process of FIG. 12 can be repeated for a plurality of times $t_1, t_2, \ldots, t_N$. In some examples, measured values and/or leakage current values associated with one or more times (e.g., at any one or more of times $t_0 \ldots t_N$) can be saved to memory. Additionally or alternatively, the method can include generating a measurement curve of the measured leakage current vs. time and/or vs. index. In some examples, a trend of leakage current over time can be used to determine information regarding a likely cause of the leakage current.

In some embodiments, determining if the leakage current satisfies a predetermined condition (e.g., step 1206) can include determining if a single leakage current value satisfies a condition, such as a determined leakage current exceeding a threshold leakage current value or falling within a predetermined range of leakage current values. Additionally or alternatively, determining if the leakage current satisfies a predetermined condition can include determining if a trend of leakage current vs. time and/or time index satisfies a predetermined condition, such as if the derivative of the leakage current over time exceeds a predetermined threshold.

In some embodiments, one or more actions can be taken in response to the leakage current satisfying a predetermined condition, such as shown in steps 1212, 1214, and 1216. In some instances, different such actions or combinations thereof can be performed in response to different leakage current conditions, such as a leakage current value falling into different predetermined ranges and/or a leakage current trend over time satisfying one or more predetermined conditions. In some embodiments, leakage current compensation can be initiated and/or modified by a user in the event that the privacy glazing structure has optically degraded.

In some examples, non-linearities in the current response with respect to an applied voltage can be attributed to ion behavior in the privacy glazing structure. In some such examples, such non-linear responses can be analyzed to determine various parameters, such as various sizes and/or densities of ions moving in the structure and the response of such ions to the applied electric field in the structure. In some embodiments, such information can be used to determine details regarding the optically active material and how such material is breaking down during operation causing optical degradation of the privacy glazing structure. In some embodiments, data of leakage current over time can be used to determine one or more leakage current sources, such as bad coatings, ion generation, and/or other factors.

Various such calculations and/or determinations can be performed locally, for instance, via the driver, and/or can be performed in an external environment, such as via cloud-based computing.

As described with respect to FIG. 6, a single driver 300 can be configured to provide electrical drive signals to each of a plurality of privacy glazing structures (e.g., 310, 320, 330) for simultaneous operation of such structures. As described herein, a driver can be configured to determine electrical characteristics of a privacy glazing structure in order to establish an electrical drive signal appropriate for driving such a structure. In some embodiments, a driver can be configured to perform various such processes (e.g., as shown in FIGS. 7, 9, and/or 12) for each of a plurality of associated privacy glazing structures. A driver can be configured to determine an appropriate electrical drive signal for each of a plurality of privacy glazing structures, and provide such electrical drive signals to each such privacy glazing structure simultaneously.

As described elsewhere herein, in some examples, the electrical drive signal comprises a square wave or an approximately square wave (e.g., a square wave having a slew rate, a trapezoidal wave, a square wave shape having a slow zero-crossover, etc.) signal. For instance, the exemplary voltage vs. time drive signals shown in FIGS. 4, 10A, and 10B show an approximate square wave drive signal. Further, as shown in FIGS. 10A and 10B, transitions that occur every half-period in the square wave drive signal results in a spike in the current through the structure. In general, given a capacitive privacy glazing structure, the steeper the edge of the square wave drive signal, the larger the corresponding current spike is likely to be. Thus, if a plurality of privacy glazing structures are being driven simultaneously with square wave or approximate square wave drive signals, current spikes in each structure may occur at approximately the same time, creating a large current/power peaks output from the driver.

In some embodiments, the driver is configured to stagger the electrical drive signals applied to one or more privacy glazing structures to reduce the peak current/power draw associated with the current response to the applied electrical drive signals. Put differently, staggering the electrical drive signals can be done so that the peak current drawn by each of the privacy glazing structures driven by the driver occurs at different times. In some embodiments, staggering a second electrical drive signal with respect to a first electrical drive signal comprises delaying the application of the second electrical drive signal with respect to the application of the first electrical drive signal when the first and second electrical drive signals are in phase with one another. In some examples, staggering a second electrical drive signal with respect to a first electrical drive signal comprises applying the first and second electrical drive signals substantially simultaneously while phase-shifting the second electrical drive signal relative to the first electrical drive signal. In still further embodiments, staggering a second electrical drive signal with respect to a first electrical drive signal comprises phase shifting the second electrical drive signal with respect to the first electrical drive signal and temporally delaying the application of the second electrical drive signal with respect to the application of the first electrical drive signal. Thus, in various embodiments, staggering electrical drive signals can include phase-shifting a signal, temporally delaying the application of a signal, or combinations thereof.

FIG. 13 shows a process flow diagram showing an example process for applying staggered electrical drive signals to a plurality of privacy glazing structures. The method includes applying an electrical sensing pulse to each of a plurality of privacy glazing structures (1300) and determining an electrical drive signal for each of the plurality of privacy glazing structures (1302). Such steps can be performed for each of the privacy glazing structures, for example, as described with respect to FIG. 7.

The method of FIG. 13 further includes determining a stagger amount for one or more of the privacy glazing structures (1304). Such determining can be performed in a variety of ways. In some examples, the driver can be configured to provide a predetermined amount of delay between the electrical drive signals for each privacy glazing structure. Additionally or alternatively, in some examples, the driver can be configured to analyze the determined plurality of electrical drive signals in order to determine an appropriate amount of stagger for applying the plurality of electrical drive signals. For instance, one or more parameters of each electrical drive signal, such as magnitude, frequency, and the like, can be analyzed to determine an appropriate amount of stagger between the electrical drive signals, for example, to reduce instances of signal superposition that can result in large current and/or power spikes. In some embodiments, frequency content of a first electrical drive signal and a second electrical drive signal can be compared in order to determine an offset between the first and second electrical drive signals to reduce or eliminate superposition of one or more features of the drive signals, such as transitions between states in square wave drive signals.

In some examples, each of the plurality of electrical drive signals for the corresponding plurality of privacy glazing structures is staggered with respect to the other signals so that no two signals are applied simultaneously. In other examples, the driver may determine that two or more electrical drive signals can be applied simultaneously without resulting in an undesirable current spike (e.g., resulting in a total current draw, such as a peak current draw, exceeding a predetermined threshold). In some such examples, the driver can be configured to provide such electrical drive signals simultaneously while potentially staggering other electrical drive signals.

The method of FIG. 13 further includes applying an electrical drive signal to each of the plurality of privacy glazing structures including the determined stagger amounts (1306). Including the stagger amounts in applying an electrical drive signal can include delaying the application of a determined electrical drive signal and/or phase-shifting the electrical drive signal. As described, in some cases, determined stagger amounts can result in multiple electrical drive signals (e.g., a subset of a plurality of applied electrical drive signals) being applied to corresponding privacy glazing structures simultaneously and in-phase with one another while other signals are staggered with respect to the simultaneously-applied signals. In other examples, each electrical drive signal is delayed and/or phase-shifted with respect to each of the other electrical drive signals.

In some embodiments, the driver can be configured to adjust one or more electrical drive signals in order to better stagger such signals. For instance, as represented by the broken lines in FIG. 13, a driver can be configured to determine a stagger amount (1304) based on adjusted electrical drive signals (e.g., different electrical drive signals than determined via the method of FIG. 7). Thus, in some such embodiments, the driver can be configured to determine updated electrical drive signals (1302) after determining appropriate stagger amounts to reduce peak current and/or power loads on the driver. In an exemplary embodiment, if a first privacy glazing structure is to be driven with an electrical drive signal having a first frequency and a second privacy glazing structure is to be driven with an electrical drive signal having a second frequency different from the first. Staggering such signals by a phase shift and/or delay may reduce the current spikes associated with the initial application of the respective electrical drive signals. However, superposition of such electrical drive signals may nevertheless result in times at which undesirably large current and/or power spikes occur. In some examples, the driver can be configured to adjust one or both such electrical drive signals to reduce or eliminate such instances, such as adjusting the electrical drive signals to include a common frequency and/or adjusting the magnitude of one or both signals so that combined current and/or power spikes remain below a threshold level. Other techniques for adjusting one or more electrical drive signals for corresponding one or more privacy glazing structures in response to staggering analysis are possible. In some such examples, upon adjusting one or more such electrical drive signals to reduce instances of undesirably large current and/or power spikes, the determined electrical drive signals including the determined stagger amounts can be applied to respective privacy glazing structures (1306).

FIGS. 14 and 15 show example implementations of applying electrical drive signals including determined amounts of stagger to a plurality of privacy glazing structures. FIG. 14 shows a driver 1400 in electrical communication with privacy glazing structures 1410, 1420, and 1430.

In the illustrated example of FIG. 14, a driver 1400 provides a common electrical drive signal f(t) to each of privacy glazing structure 1410, 1420, and 1430. For example, each privacy glazing structure 1410, 1420, and 1430 could be the same type of structure, include similar electrical characteristics, or the like, in order to result in the same general electrical drive signal to be applied to each structure, such as determined via the method of FIG. 7.

As shown in FIG. 14, the electrical drive signal f(t) is phase-shifted between each privacy glazing structure to reduce or eliminate current spikes at each structure simultaneously. For instance, while signal f(t) is provided to privacy glazing structure 1410, signal f(t−Δt) is applied to privacy glazing structure 1420. Thus, various elements of the electrical drive signals and the resulting current response (e.g., current spikes) will be delayed by an amount Δt in privacy glazing structure 1420 with respect to privacy glazing structure 1410. Similarly, signal f(t−2Δt) is applied to privacy glazing structure 1430, such that elements of the electrical drive signal and resulting current response will be delayed by Δt in privacy glazing structure 1430 with respect to privacy glazing structure 1420, and by 2Δt with respect to privacy glazing structure 1410.

In some examples, the amount of stagger between each of the plurality of electrical drive signals is within one period of the electrical drive signal. For example, if the system in FIG. 14 includes privacy glazing structures 1410, 1420, and 1430, and electrical drive signal f(t) is periodic with a period of T, in some instances, 2Δt<T. For instance, if the frequency of the electric drive signal f(t) is 60 Hz, then in some examples, Δt<8.3 ms. In still further examples, the amount of stagger between each of the plurality of electrical drive signals is within a half period of the electrical drive signal.

FIG. 15 shows a driver 1500 providing electrical drive signals to each of a plurality of privacy glazing structures 1510, 1520, and 1530. As shown, in some examples, different electrical drive signals f(t), g(t), and h(t) can be provided to the privacy glazing structures 1510, 1520 and 1530, respectively. Such electrical drive signals can be determined for each privacy glazing structure, for example, via the method shown in FIG. 7. Different electrical drive signals can include one or more different parameters, such as peak voltage, slew rate, wave shape, frequency, and the like. As described elsewhere herein, in some examples, the driver can determine an amount of stagger to apply between different electrical drive signals, for example, based on mathematical analysis of the determined electrical drive signals. In the illustrated example, the electrical drive signal g(t) applied to privacy glazing structure 1520 is staggered with respect to electrical drive signal f(t) by an amount $\Delta t_1$ and the electrical drive signal h(t) applied to privacy glazing structure 1530 is staggered with respect to electrical drive signal f(t) by an amount $\Delta t_2$. In various examples, $\Delta t_1$ can be greater than, less than, or equal to $\Delta t_2$ according to the determined amount(s) of stagger based on the determined electrical drive signals. As described elsewhere herein, in some examples, different electrical drive signals can be applied simultaneously (e.g., $\Delta t_1=0$, $\Delta t_2=0$, and/or $\Delta t_1=\Delta t_2$) if the driver determines that the combined current response to such electrical drive signals would not amount to an undesirably large current and/or power spike (e.g., greater than a predetermined threshold), for example, due to certain load sizes provided by a plurality of such privacy glazing structure.

FIGS. 16A-16C show example voltage vs. time profiles for a plurality of electrical drive signals used to drive a corresponding plurality of privacy glazing structures in a system. FIG. 16A shows a function f(t). FIG. 16B shows function f(t) delayed by a time Δt, such that the resulting signal can be represented by f(t−Δt). Similarly, FIG. 16C shows function f(t) delayed by a time 2Δt, such that the resulting signal can be represented by f(t−2Δt). In the illustrated example of FIGS. 16A-16C, an electrical drive signal f(t) is applied to separate privacy glazing structures with incorporated staggering so that various transition portions of each electrical drive signal that may cause individual current and/or power spikes do not happen simultaneously.

In some embodiments, once a plurality of drive signals are determined, the driver can determine which electrical drive signals, when applied simultaneously, cause one or more parameters (e.g., current spike values) to exceed a predetermined threshold. Similarly, the driver can determine which electrical drive signals, when combined, do not cause the one or more parameters to exceed the predetermined threshold(s). The driver can determine which electrical drive signals can be applied simultaneously and stagger the application of electrical drive signals or groups of electrical drive signals such that the one or more parameters do not exceed the predetermined threshold(s) when each electrical drive signal or group of electrical drive signals are applied.

In an example embodiment, a driver is connected to power five privacy glazing structures, three of which represent a maximum load that can be driven by the driver. The remaining two privacy glazing structures are considered small, and can be driven simultaneously without any electrical parameters exceeding a predetermined threshold. The driver can be configured to provide electrical drive signals to the two smaller loads simultaneously and in phase with one another, while staggering delivery of each of the remaining three electrical drive signals to the remaining structures.

While shown in FIGS. 14, 15, and 16A-C as including three privacy glazing structures, in general, systems can include a driver and any number of privacy glazing structures in communication therewith. The driver can be configured to perform various processes described herein for each of one or more privacy glazing structure in electrical communication therewith. In some examples, the driver can be configured to determine the number of privacy glazing structures to be provided with electrical drive signals. Such a determination can be used in determining various information, such as determining appropriate electrical drive signals and/or staggering amounts for driving the one or more privacy glazing structures.

Drivers can be configured to carry out processes as described herein in a variety of ways. In some examples, a system driver can include one or more components configured to process information, such as electrical signals and/or other received sensor information, and perform one or more corresponding actions in response thereto. Such components can include, for example, one or more processors, application specific integrated circuits (ASICs), microcontrollers, microprocessors, field-programmable gate arrays (FPGAs), or other appropriate components capable of receiving and output data and/or signals according to a predefined relationship. In some examples, the driver can include or otherwise be in communication with one or more memory components, such as one or more non-transitory computer readable media programmed with instructions for causing one or more such components to carry out such processes. Additionally or alternatively, the driver can communicate with additional devices, such as external computer systems and/or networks to facilitate information processing, such as cloud-based computing.

Various non-limiting examples have been described herein. Those having ordinary skill in the art will understand that these and others fall within the scope of the appended claims.

The invention claimed is:

1. A method for assessing and adapting to changing characteristics of an electrically controllable optical privacy glazing structure comprising:
   applying an electrical drive signal to a privacy glazing structure comprising an electrically controllable optically active material to control an optical state of the electrically controllable optically active material;
   measuring an electrical characteristic of the privacy glazing structure indicative of a health of the privacy glazing structure at a first time;
   measuring the electrical characteristic of the privacy glazing structure indicative of the health of the privacy glazing structure at a second time later than the first time;
   detecting a change in the electrical characteristic based on the electrical characteristic measured at the second time and the electrical characteristic measured at the first time, the change in the electrical characteristic indicating a change in the health of the privacy glazing structure;
   determining a leakage current value associated with the privacy glazing structure at the second time based on the detected change in the electrical characteristic of the privacy glazing structure; and
   if the determined leakage current satisfies a predetermined condition, adjusting at least one parameter of the electrical drive signal provided to the privacy glazing structure to compensate for the change in the health of the privacy glazing structure.

2. The method of claim 1, wherein measuring the electrical characteristic comprises measuring a current response to the applied electrical drive signal.

3. The method of claim 2, wherein measuring the current response to the applied electrical drive signal comprises calculating at least one of an integral and a derivative of the current over time.

4. The method of claim 3, wherein calculating at least one of an integral and a derivative of the current over time comprises calculating the at least one of the integral and the derivative of the current response to the applied electrical drive signal over one period of the applied electrical drive signal or less.

5. The method of claim 4, wherein calculating at least one of an integral and a derivative of the current over time comprises calculating the at least one of the integral and the derivative of the current response to the applied electrical drive signal over one half of one period of the applied electrical drive signal or less.

6. The method of claim 2, wherein measuring the current response to the applied electrical drive signal comprises measuring a difference in equilibrium current values during different portions of the applied electrical drive signal.

7. The method of claim 1, wherein the adjusting the one or more parameters of the electrical drive signal comprises increasing a voltage.

8. The method of claim 1, wherein the adjusting the one or more parameters of the electrical drive signal comprises decreasing a frequency.

9. The method of claim 1, wherein the adjusting the one or more parameters of the electrical drive signal comprises adding one or more voltage pulsing steps to the electrical drive signal.

10. The method of claim 1, wherein measuring an electrical characteristic of the privacy glazing structure indicative of the health of the privacy glazing structure comprises monitoring the current flowing through the privacy glazing structure while a voltage applied to the privacy glazing structure is held constant.

11. The method of claim 1, wherein the electrically controllable optically active material comprises a liquid crystal material.

12. The method of claim 1, wherein the privacy glazing structure comprises a first pane of glass, a second pane of glass, and the electrically controllable optically active material is positioned between the first pane of glass and the second pane of glass.

13. The method of claim 1, wherein the privacy glazing structure is a window or a door.

* * * * *